US010943668B2

(12) United States Patent
Terada et al.

(10) Patent No.: US 10,943,668 B2
(45) Date of Patent: Mar. 9, 2021

(54) STORAGE DEVICE FOR STORING DATA USING A RESISTIVE RANDOM ACCESS STORAGE ELEMENT

(71) Applicant: SONY SEMICONDUCTOR SOLUTIONS CORPORATION, Kanagawa (JP)

(72) Inventors: Haruhiko Terada, Kanagawa (JP); Makoto Kitagawa, Kanagawa (JP); Yoshiyuki Shibahara, Tokyo (JP); Yotaro Mori, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/491,031

(22) PCT Filed: Mar. 13, 2018

(86) PCT No.: PCT/JP2018/009682
§ 371 (c)(1),
(2) Date: Sep. 4, 2019

(87) PCT Pub. No.: WO2018/173851
PCT Pub. Date: Sep. 27, 2018

(65) Prior Publication Data
US 2020/0020411 A1    Jan. 16, 2020

(30) Foreign Application Priority Data
Mar. 24, 2017   (JP) .............................. JP2017-059523

(51) Int. Cl.
*G11C 29/24*    (2006.01)
*H01L 27/24*    (2006.01)
(Continued)

(52) U.S. Cl.
CPC .............. *G11C 29/24* (2013.01); *G11C 5/02* (2013.01); *G11C 13/0021* (2013.01);
(Continued)

(58) Field of Classification Search
CPC ........... G11C 5/025; G11C 5/06; G11C 5/063; G11C 8/08; H01L 45/04; H01L 45/06;
(Continued)

(56) References Cited

U.S. PATENT DOCUMENTS 8,891,280 B2 * 11/2014 Castro .................... G11C 5/025
365/63
9,064,549 B2 * 6/2015 Chou ....................... G11C 8/10
(Continued)

FOREIGN PATENT DOCUMENTS

JP    2001-067892 A    3/2001
JP    2002-025255 A    1/2002
(Continued)

OTHER PUBLICATIONS

International Search Report and Written Opinion of PCT Application No. PCT/JP2018/009682, dated Apr. 17, 2018, 10 pages of ISRWO.

*Primary Examiner* — Vanthu T Nguyen
(74) *Attorney, Agent, or Firm* — Chip Law Group

(57) ABSTRACT

A storage device according to the present disclosure includes: a plurality of first wiring lines extending in a first direction and including a plurality of first selection lines and a plurality of second selection lines; a plurality of second wiring lines extending in a second direction and including a plurality of third selection lines and a plurality of fourth selection lines, the second direction intersecting the first direction; a plurality of first memory cells; a first driver including a first selection line driver that drives the plurality of first selection lines on a basis of a first selection control
(Continued)

signal and a second selection line driver that drives the plurality of second selection lines on a basis of the first selection control signal, the first and second selection line drivers being arranged side-by-side in the first direction; and a second driver including a third selection line driver that drives the plurality of third selection lines on a basis of a second selection control signal and a fourth selection line driver that drives the plurality of fourth selection lines on a basis of the second selection control signal, the third and fourth selection line drivers being arranged side-by-side in the second direction.

11 Claims, 25 Drawing Sheets

(51) Int. Cl.
    *G11C 13/00*         (2006.01)
    *G11C 5/02*          (2006.01)
    *G11C 29/44*        (2006.01)

(52) U.S. Cl.
    CPC .......... *G11C 29/4401* (2013.01); *H01L 27/24* (2013.01); *G11C 2029/4402* (2013.01)

(58) Field of Classification Search
    CPC ... H01L 45/085; H01L 45/1233; H01L 45/14; H01L 45/144; H01L 45/146; H01L 45/147; H01L 27/0207; H01L 27/228; H01L 27/2427; H01L 27/2463; H01L 27/2481; H01L 21/76838
    See application file for complete search history.

(56) References Cited

U.S. PATENT DOCUMENTS

| | | | |
|---|---|---|---|
| 9,236,149 B2* | 1/2016 | Mochida | G11C 29/76 |
| 10,347,333 B2* | 7/2019 | Laurent | G11C 13/0028 |
| 2002/0003747 A1 | 1/2002 | Yahata et al. | |
| 2009/0256133 A1* | 10/2009 | Kau | G11C 5/02 |
| | | | 257/5 |
| 2015/0117088 A1 | 4/2015 | Kunitake | |
| 2017/0270403 A1* | 9/2017 | Zhang | G06N 3/04 |

FOREIGN PATENT DOCUMENTS

| | | |
|---|---|---|
| JP | 2014-199705 A | 10/2014 |
| JP | 2015-088727 A | 5/2015 |
| KR | 10-2002-0004859 A | 1/2002 |

* cited by examiner

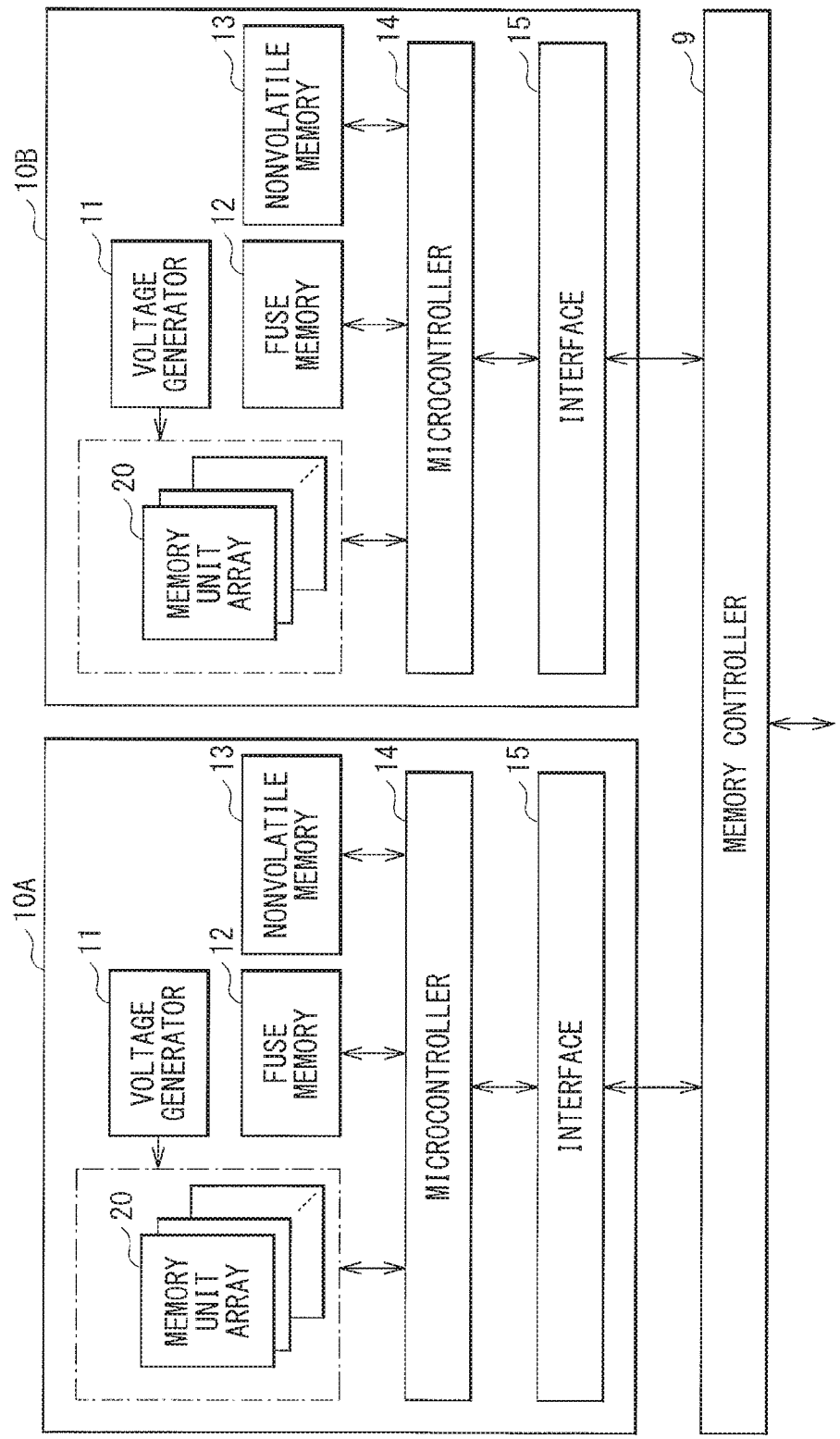
[FIG. 1]

[FIG. 2]
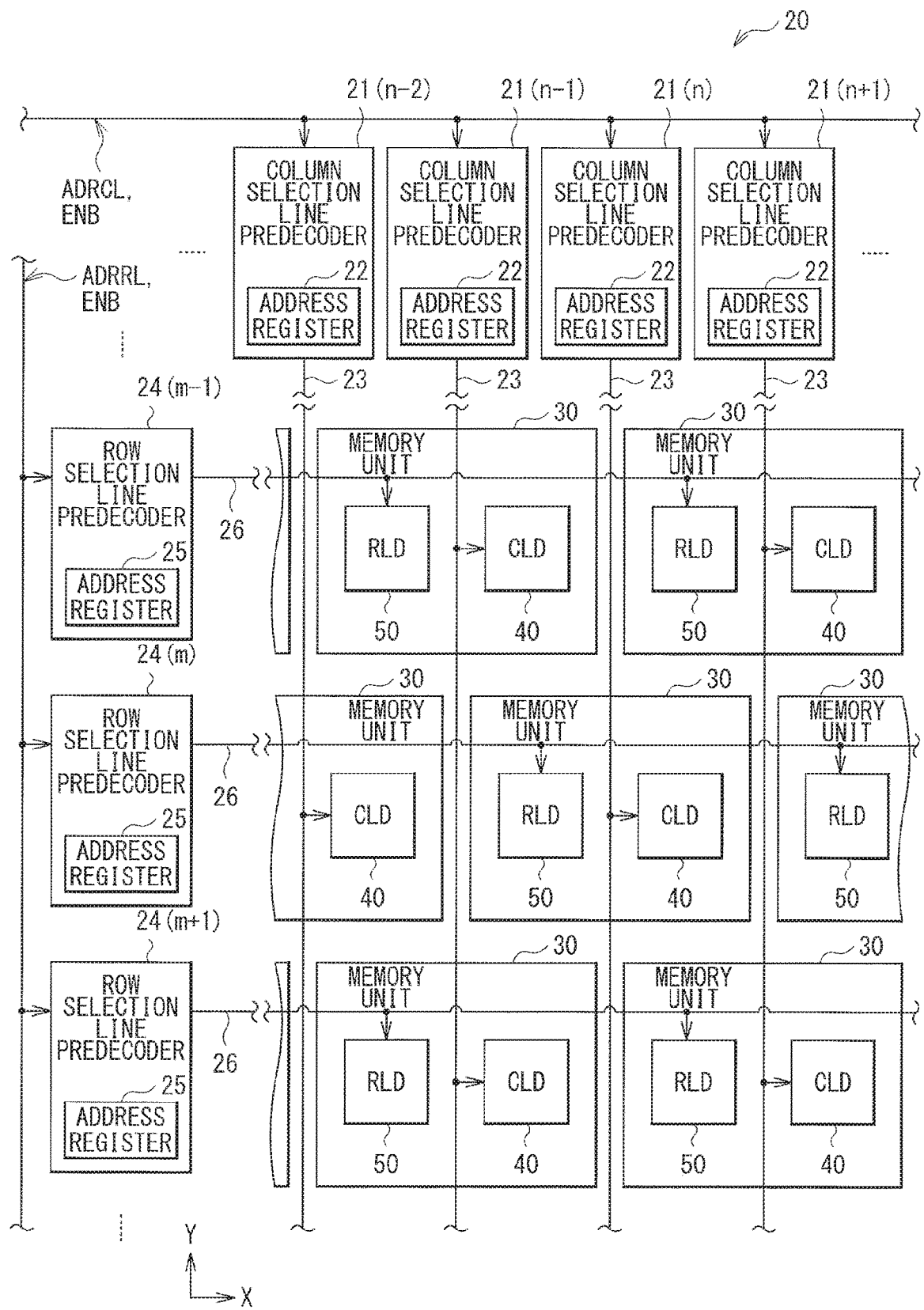

[FIG. 3]
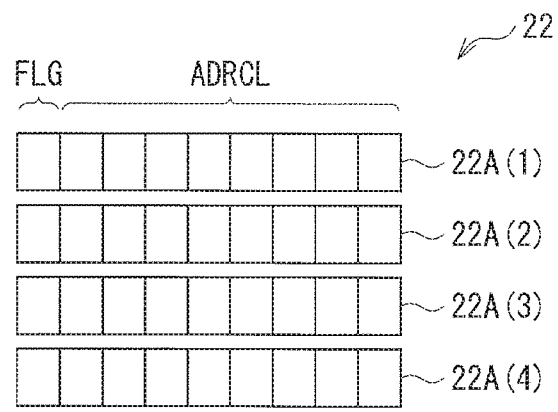
[FIG. 4]
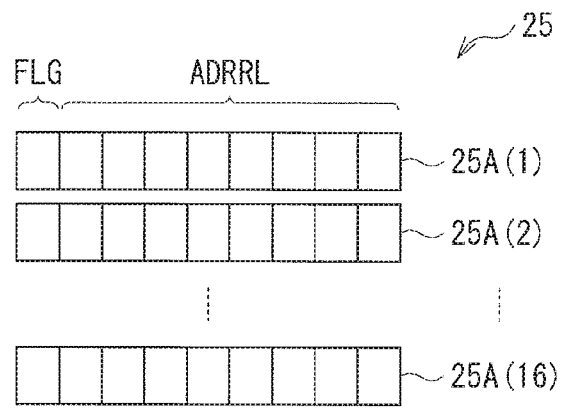

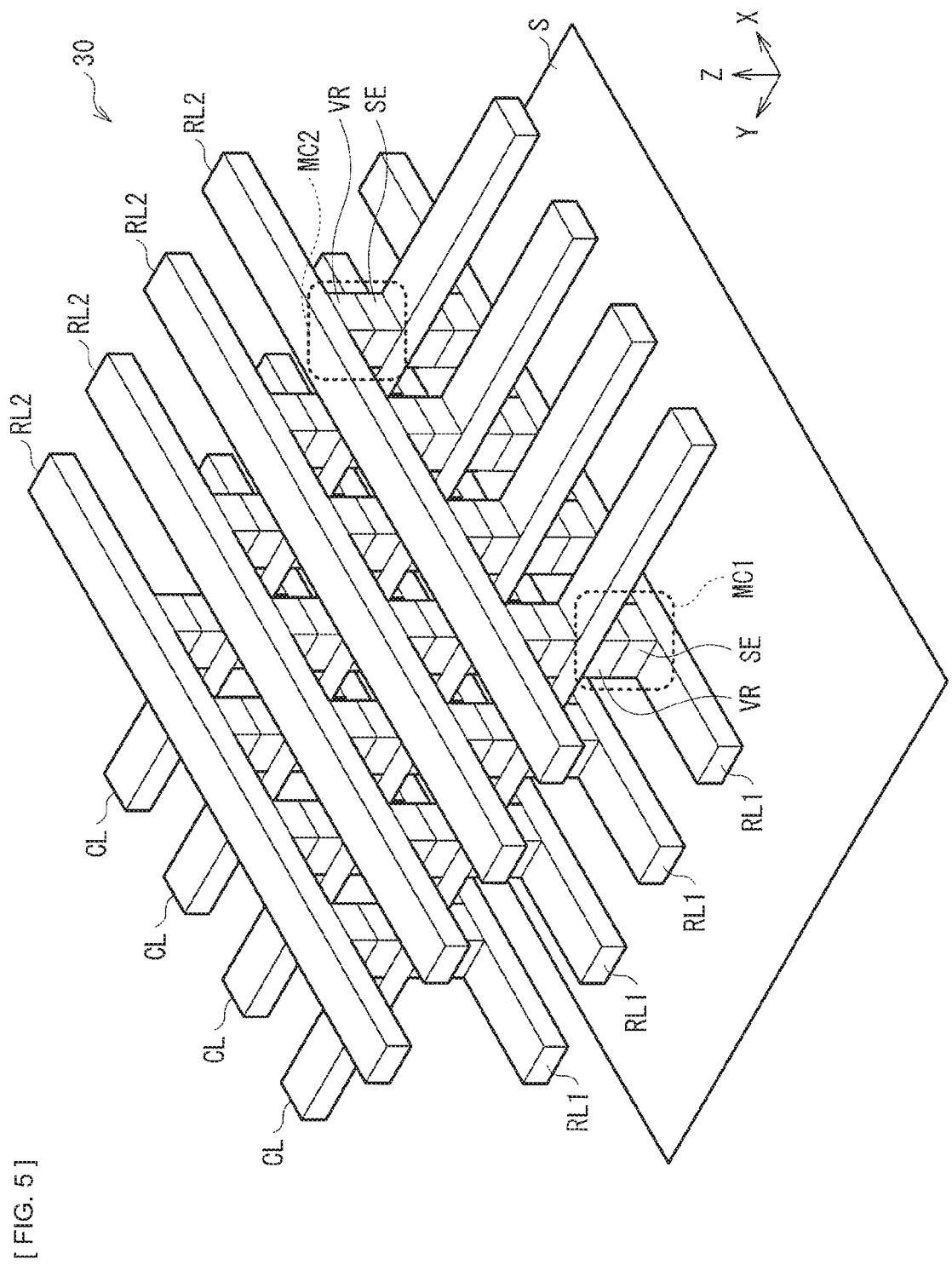
[FIG. 5]

[ FIG. 6 ]
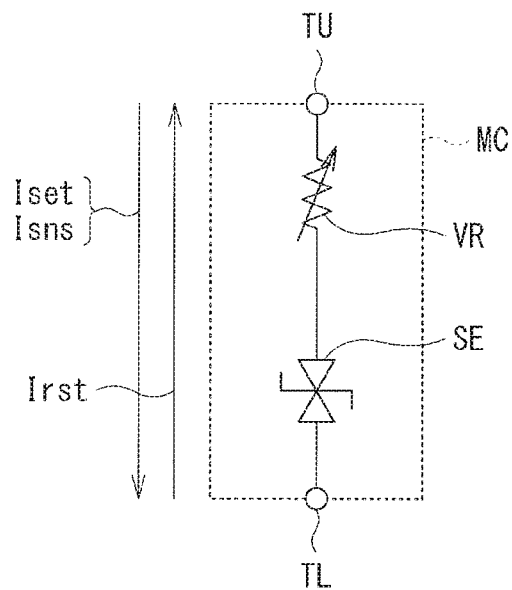
[ FIG. 7 ]
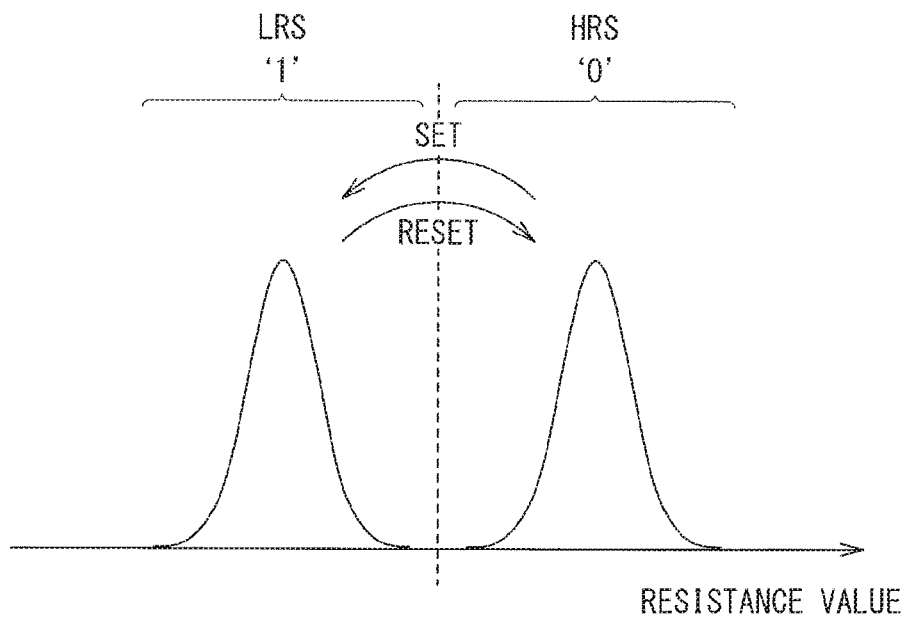

[FIG. 8]
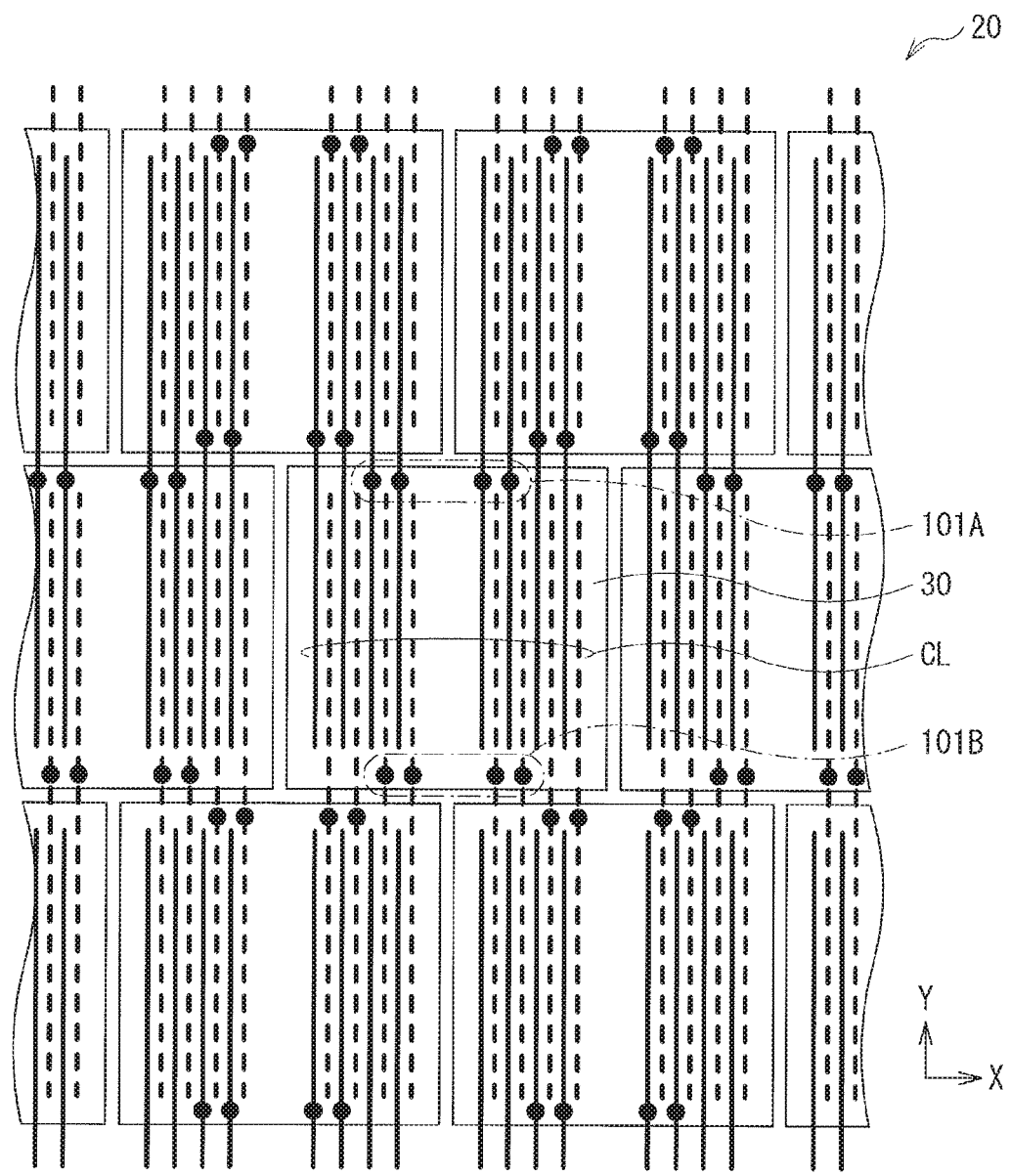

[FIG. 9]
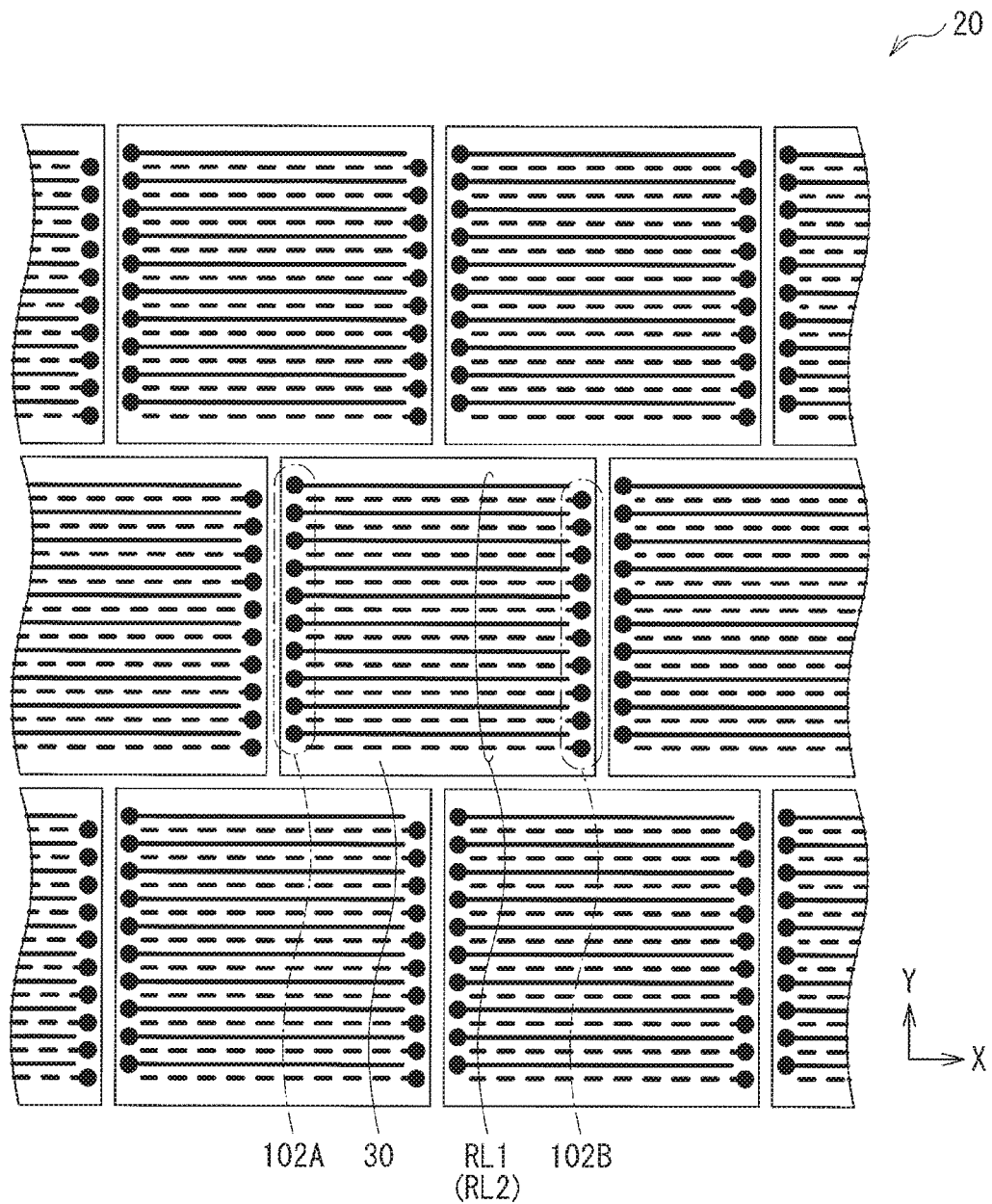
102A  30   RL1  102B
           (RL2)

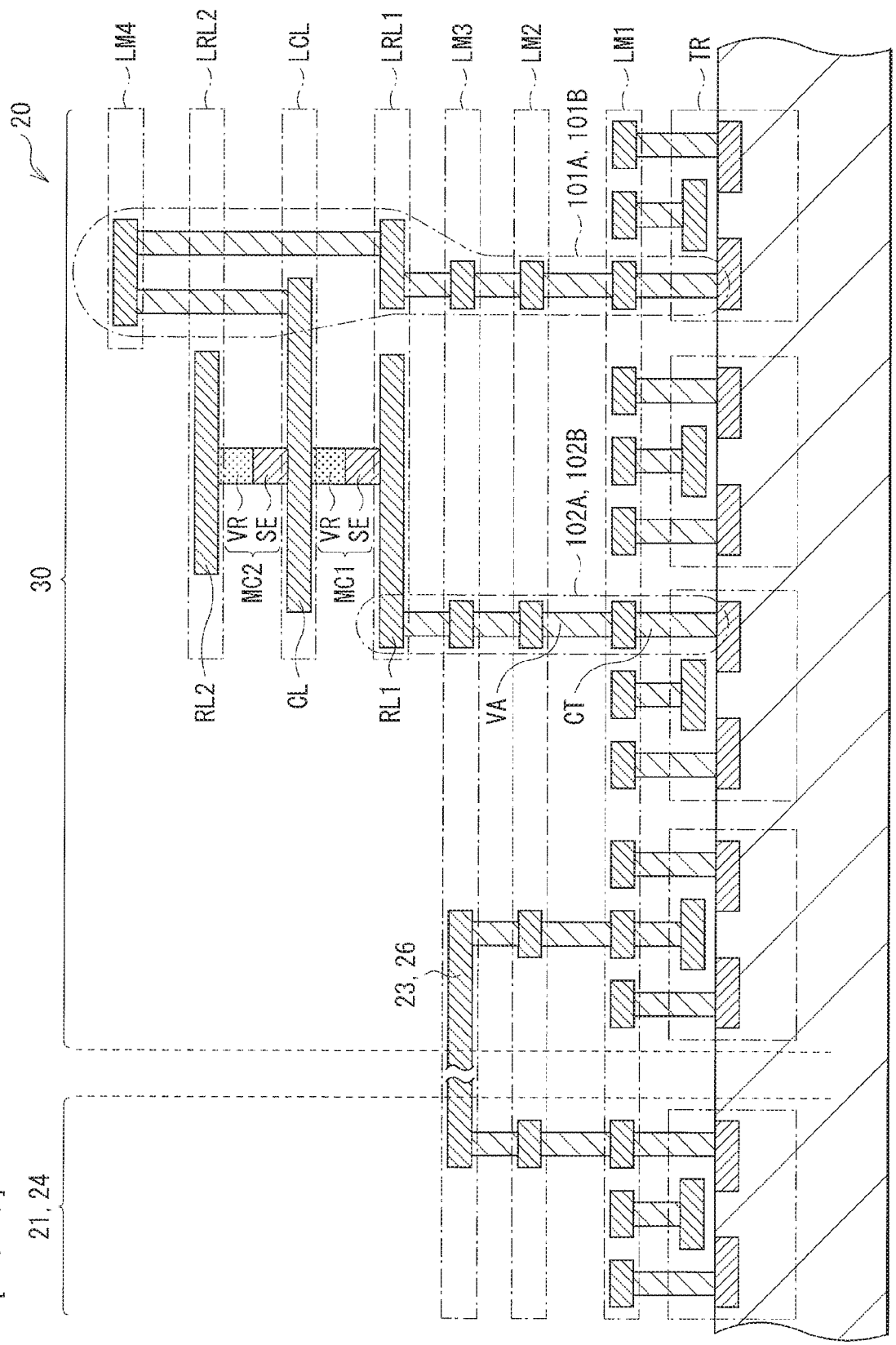
[FIG. 10]

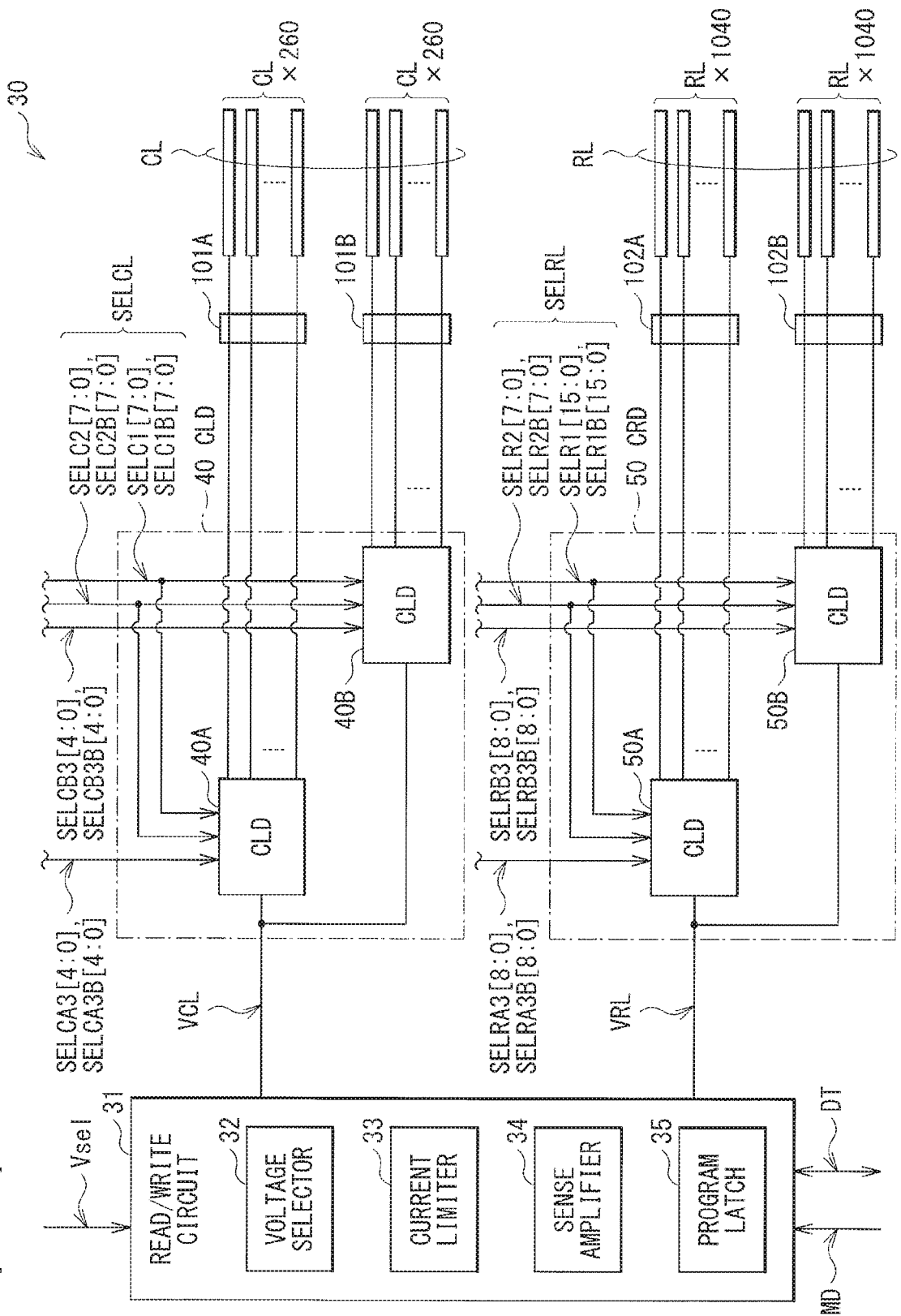
[FIG. 11]

[ FIG. 12 ]
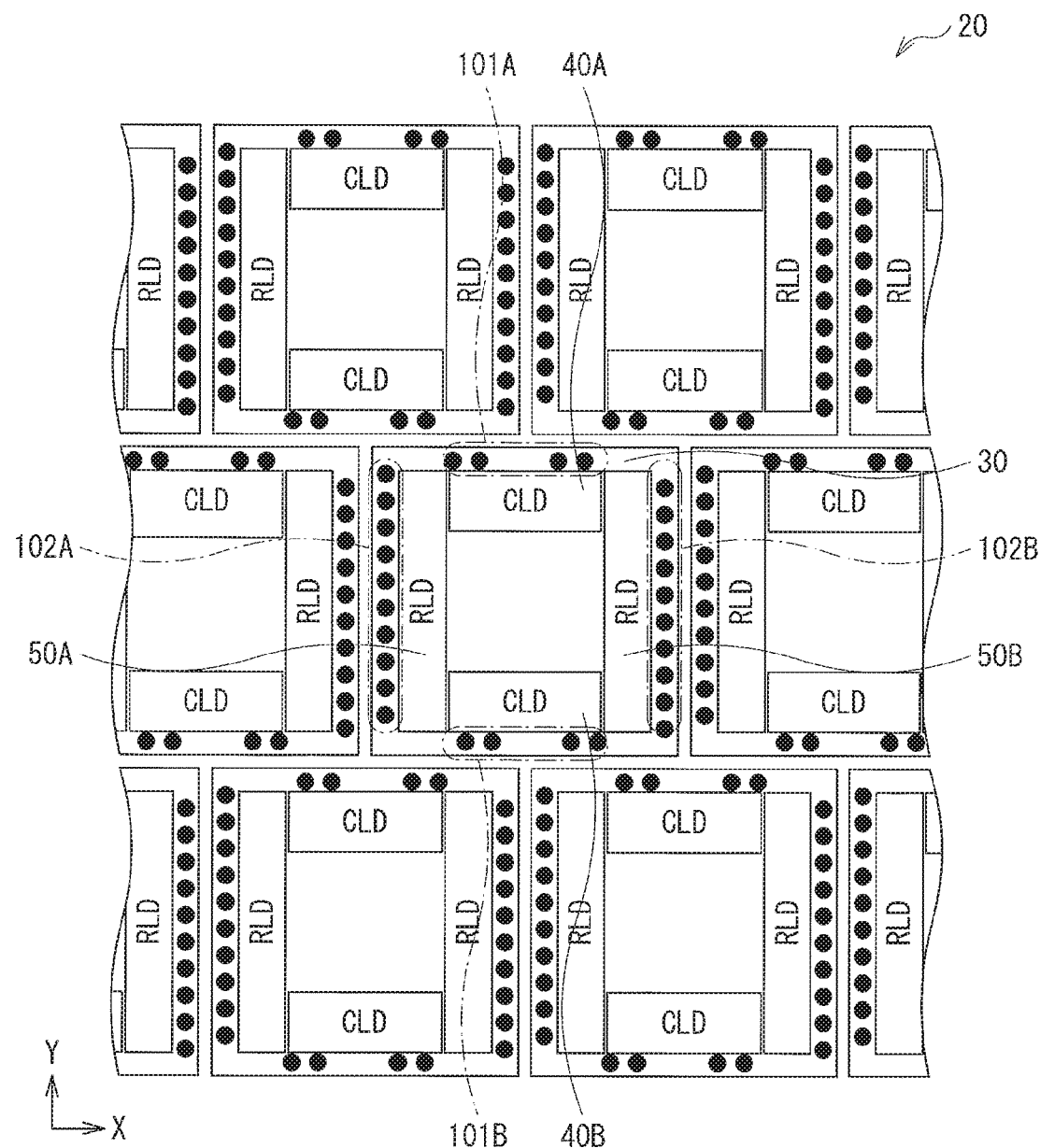

[FIG. 13]
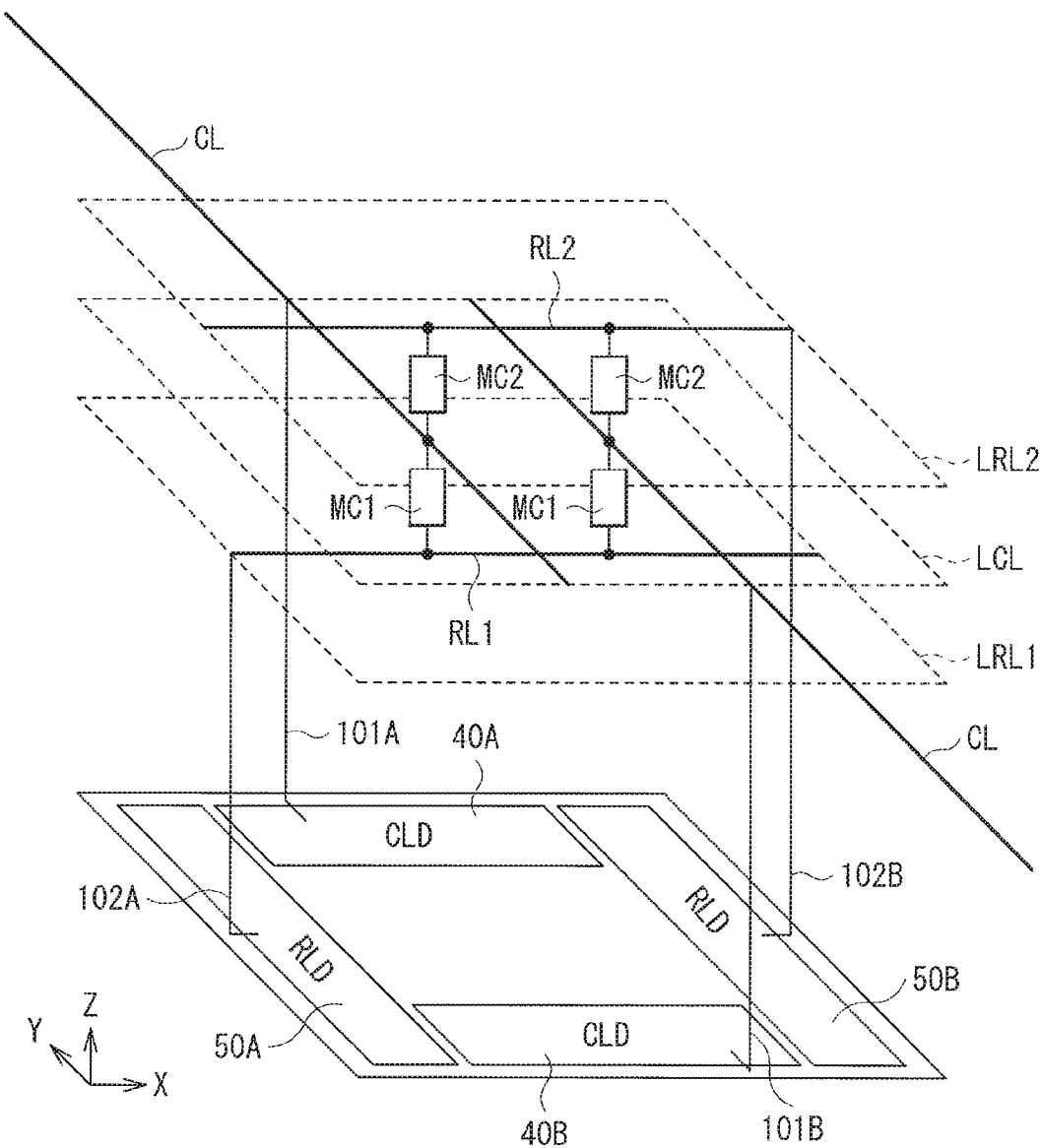

[FIG. 14]
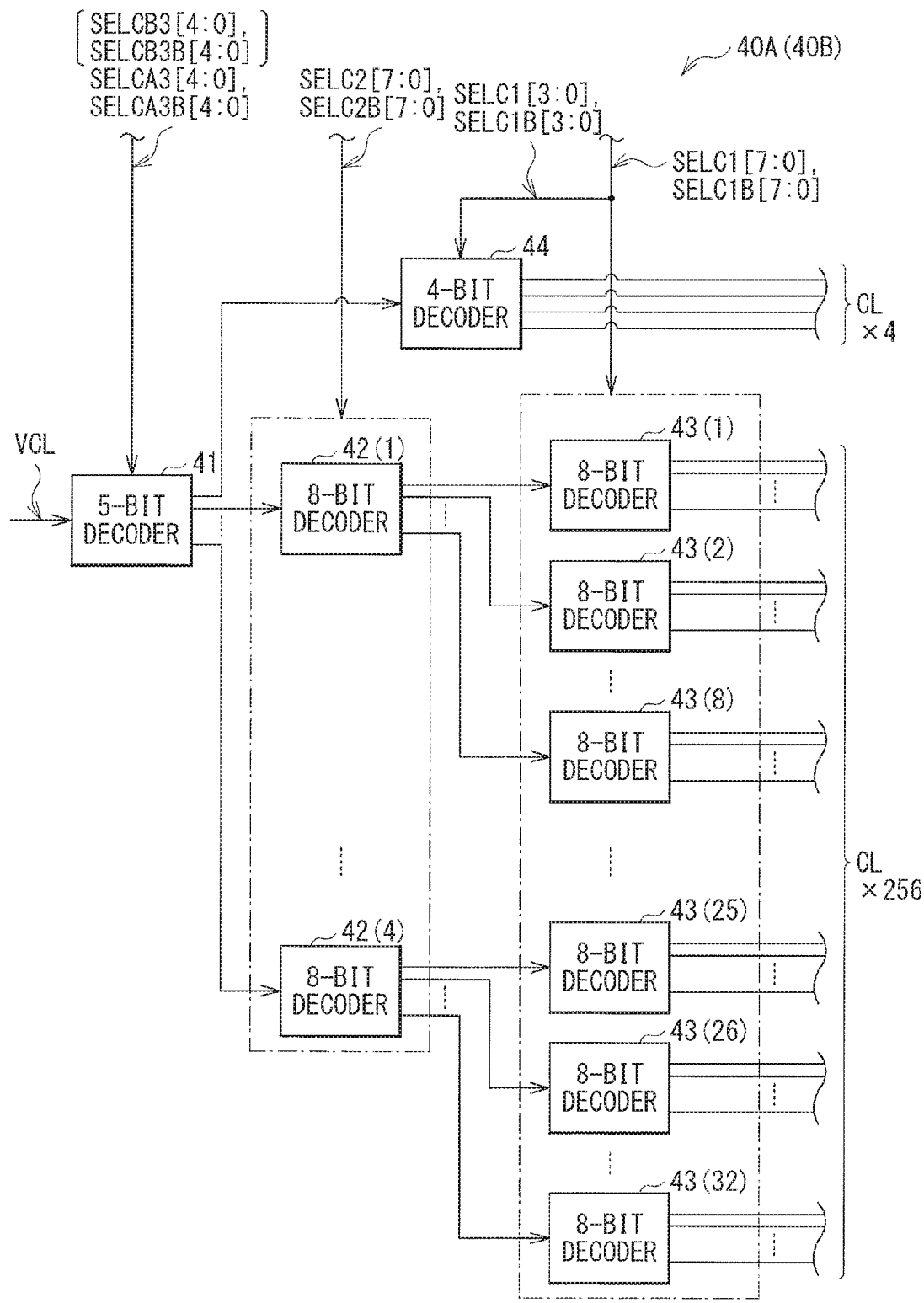

[FIG. 15]
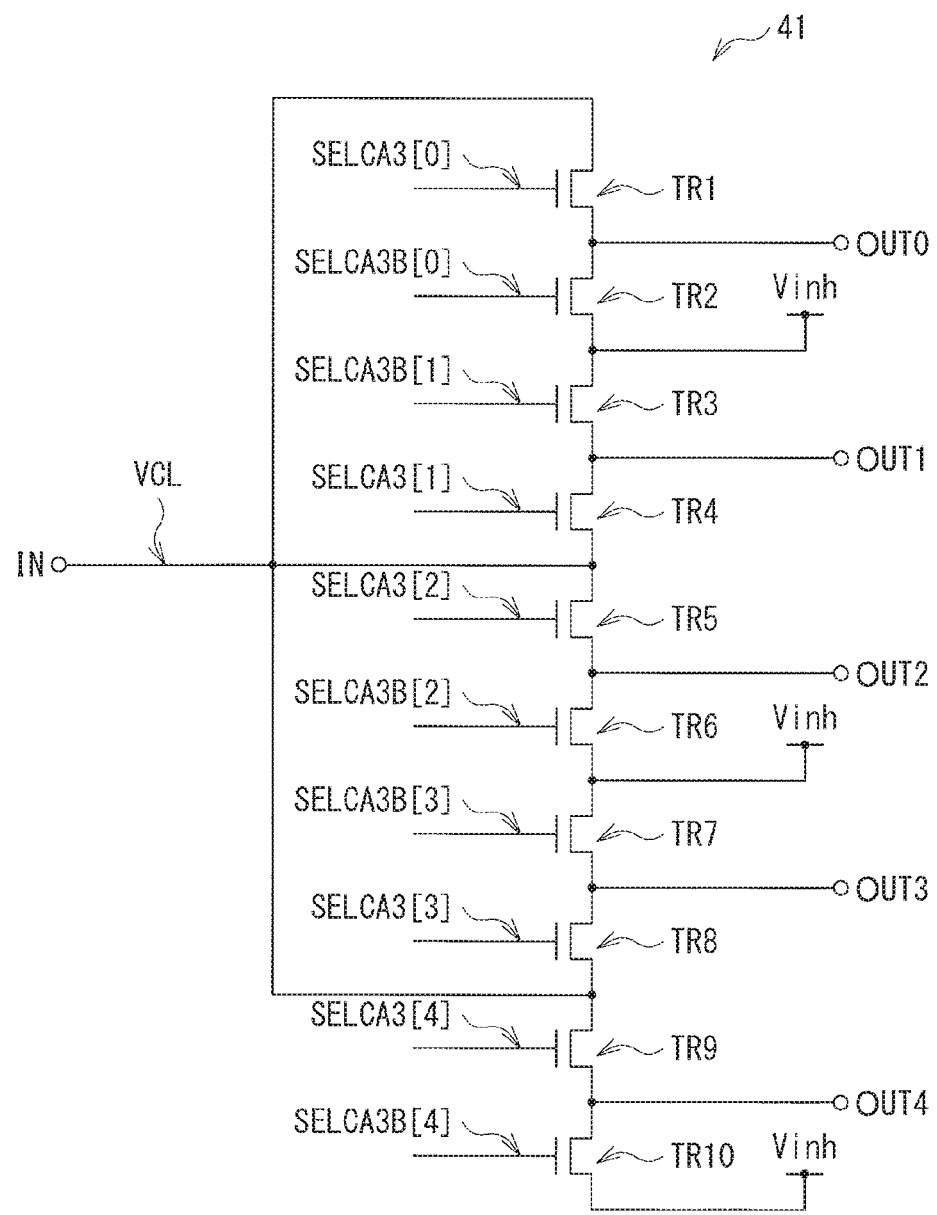

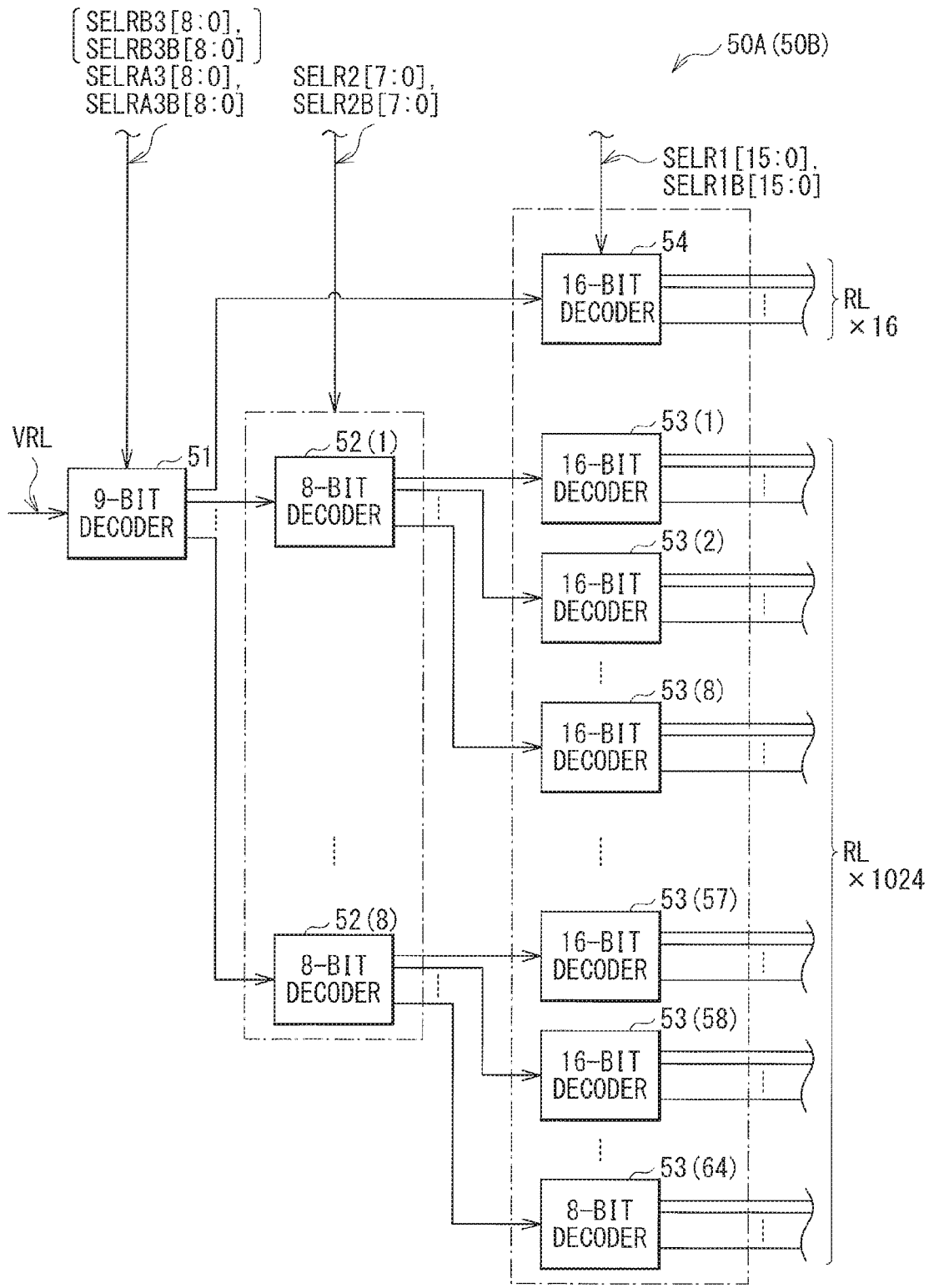
[FIG. 16]

[ FIG. 17 ]
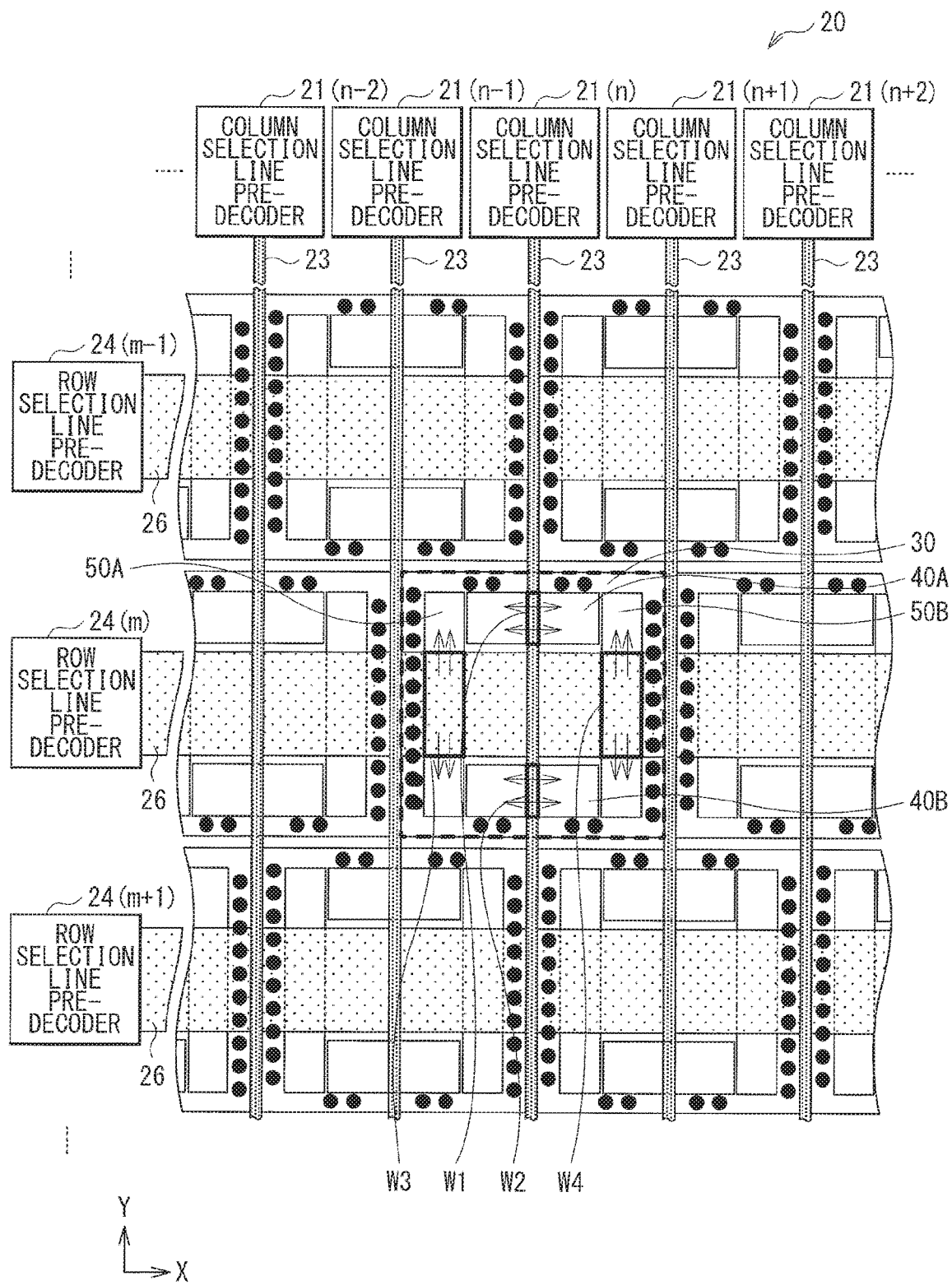

[FIG. 18]
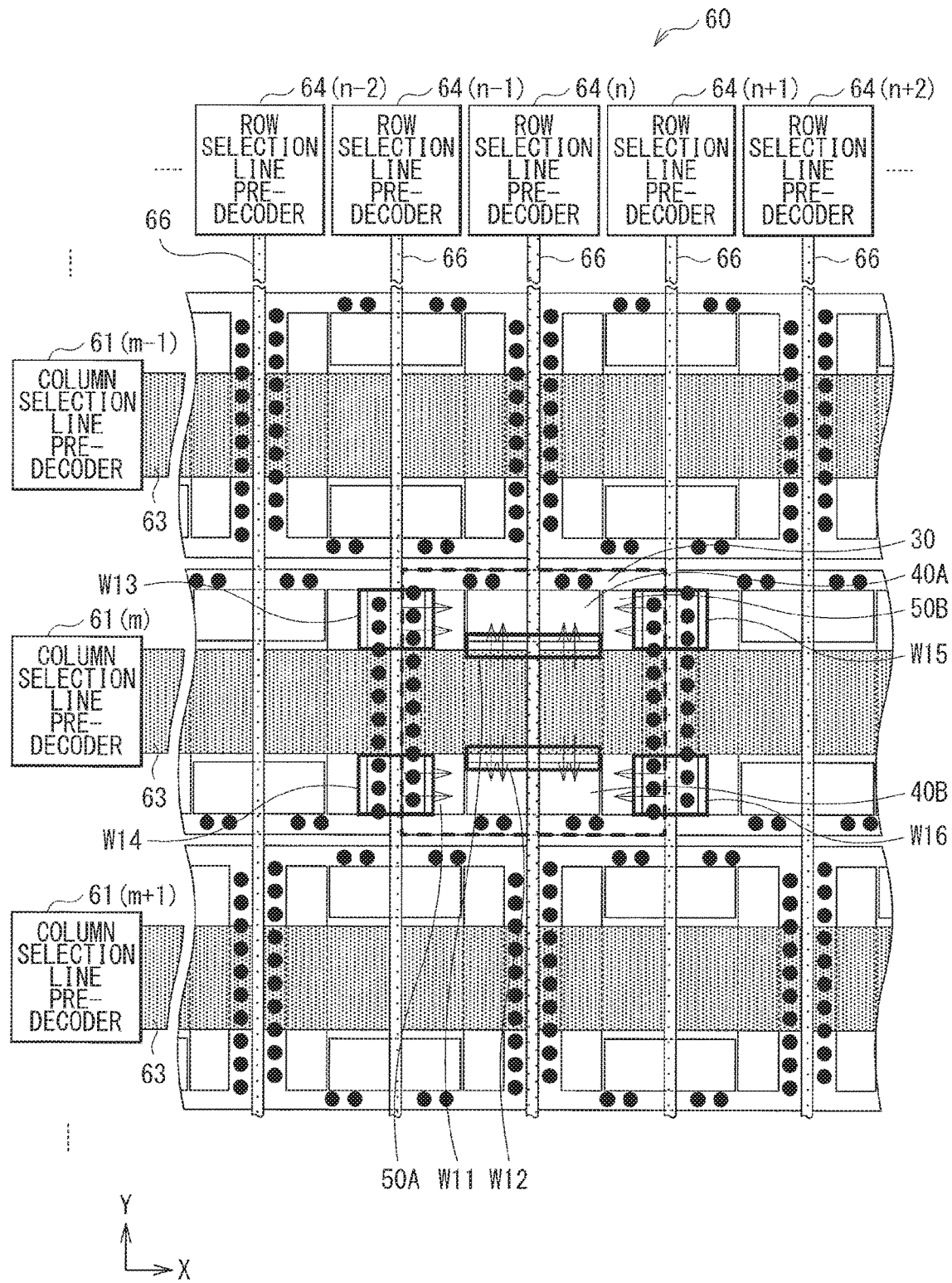

[FIG. 19]
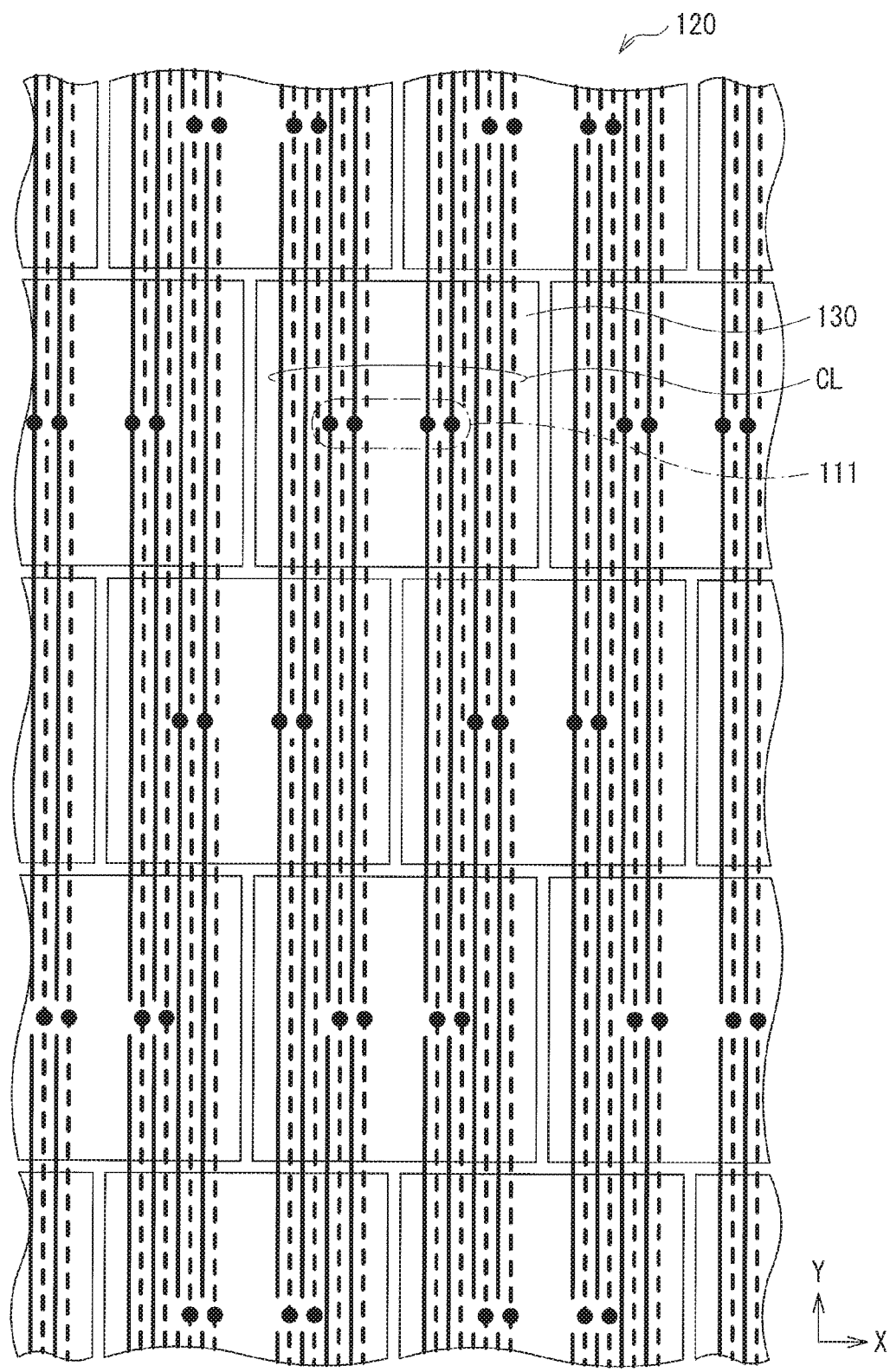

[FIG. 20]
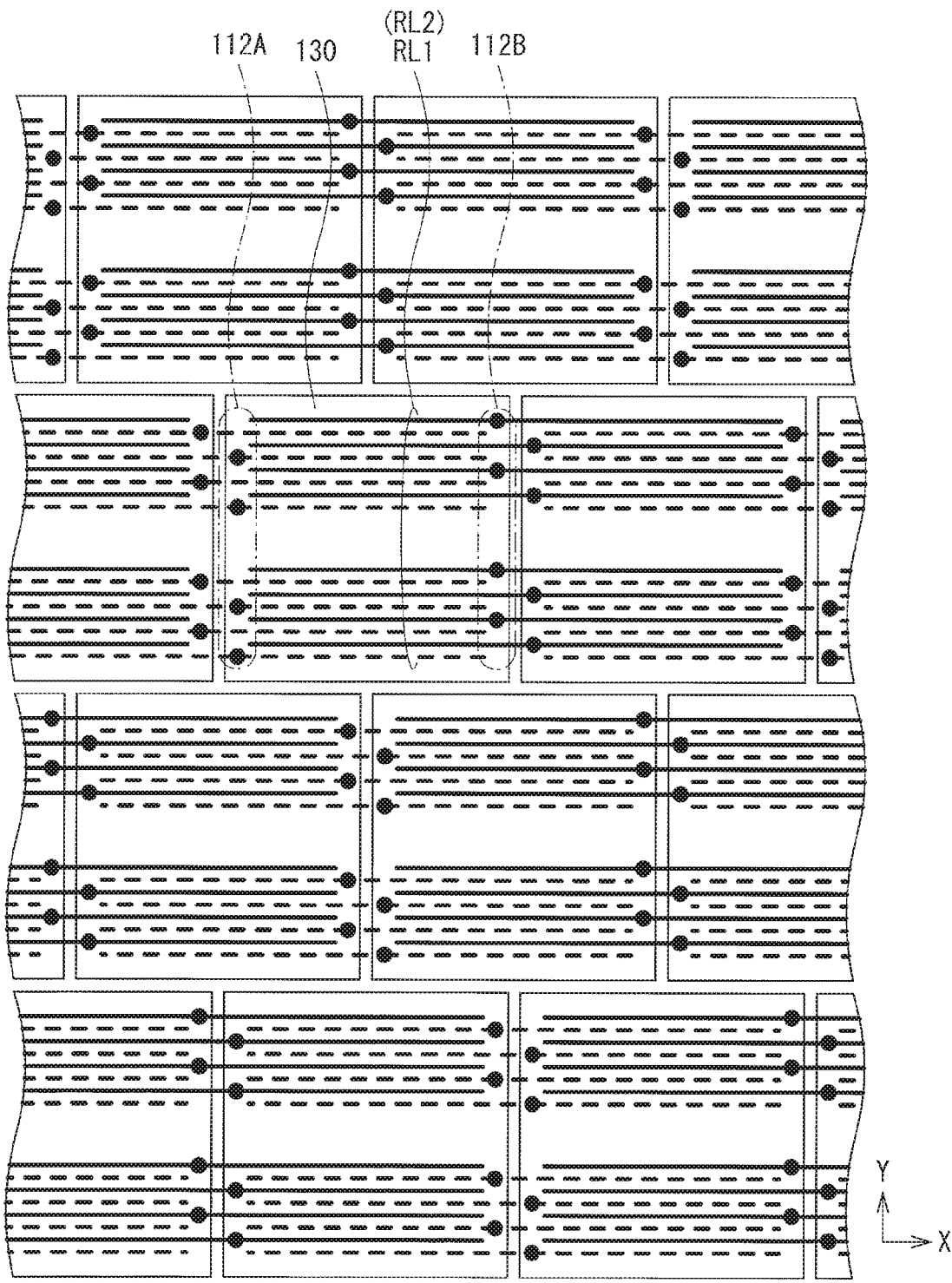

[FIG. 21]
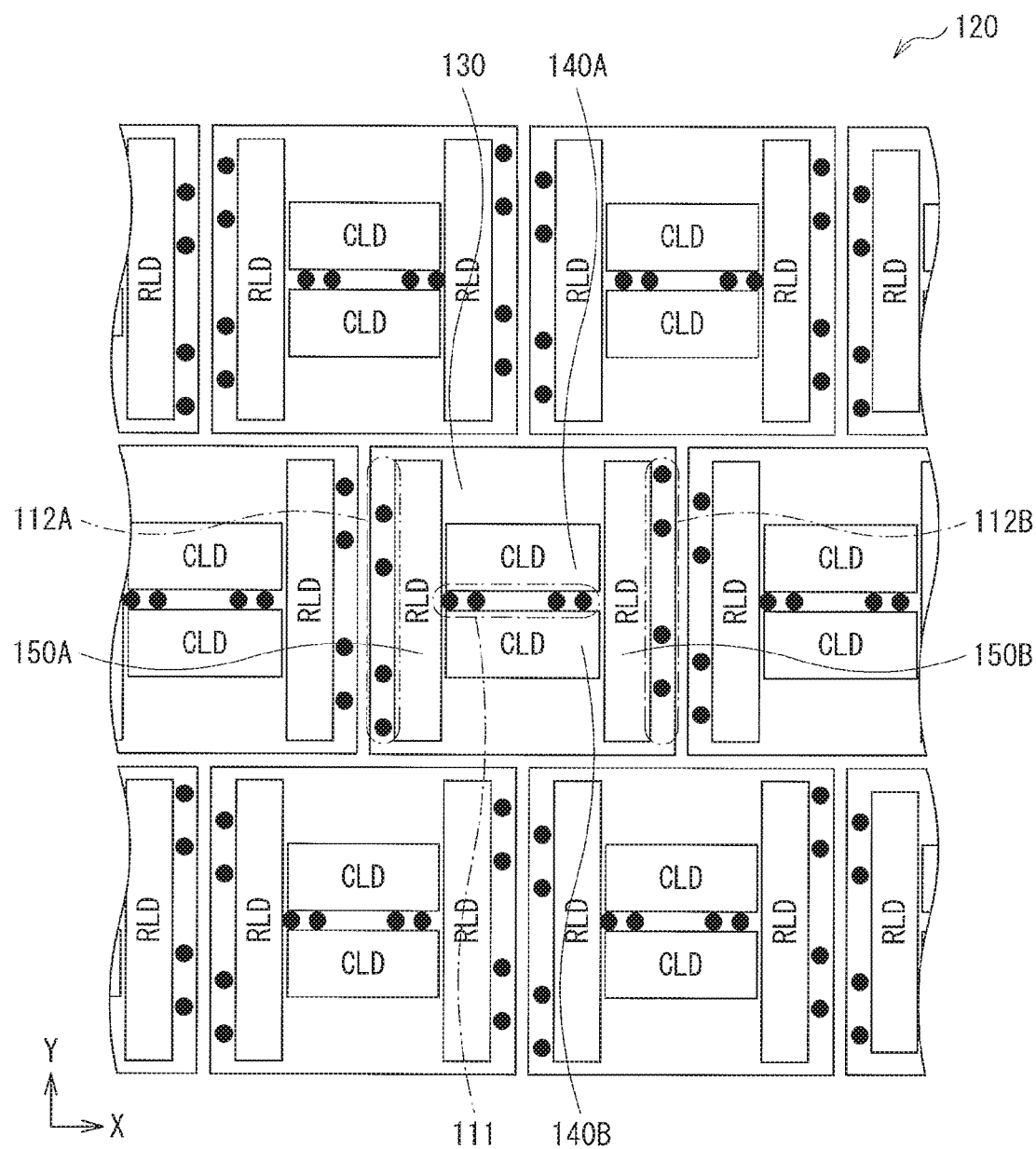

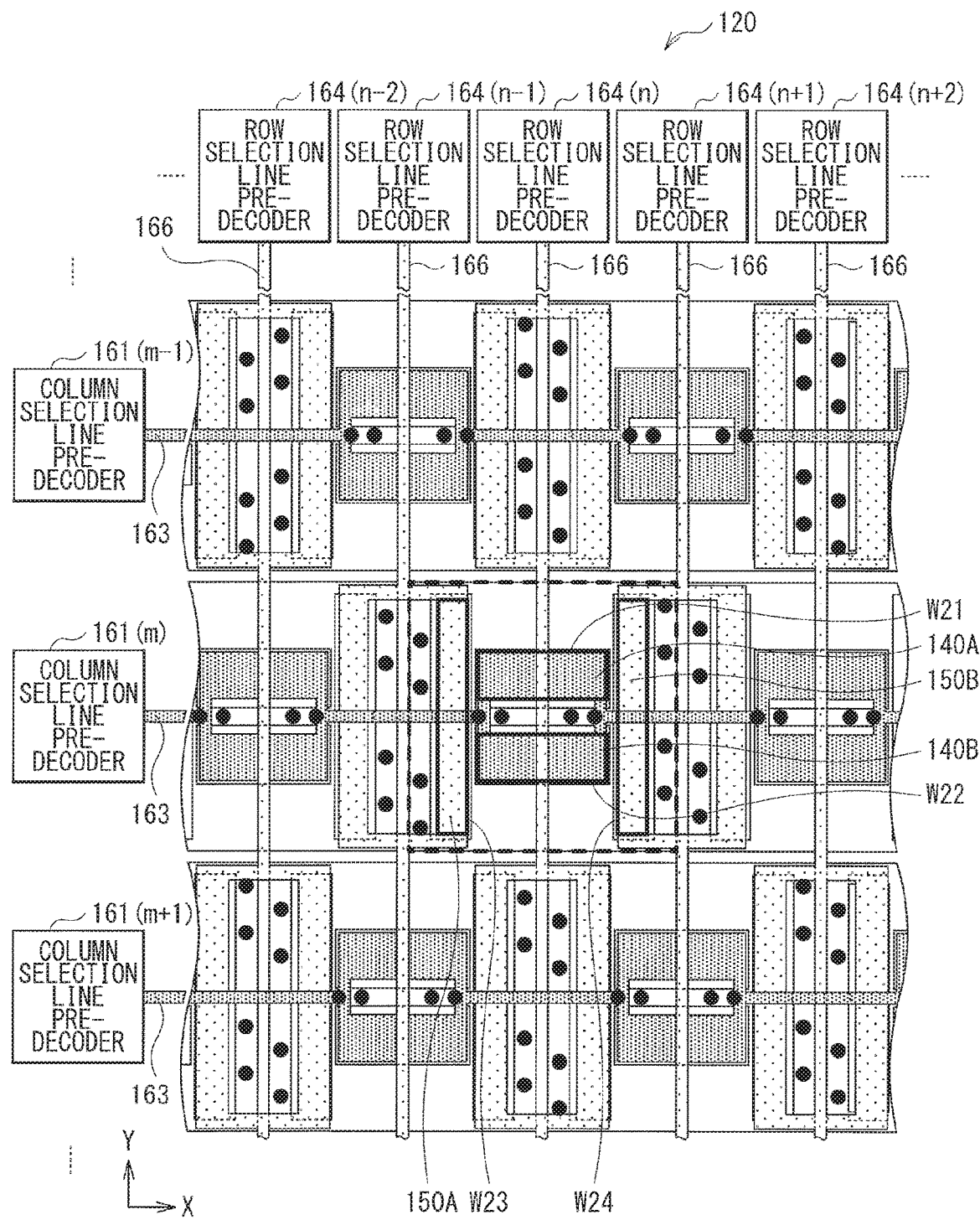
[FIG. 22]

[FIG. 23]
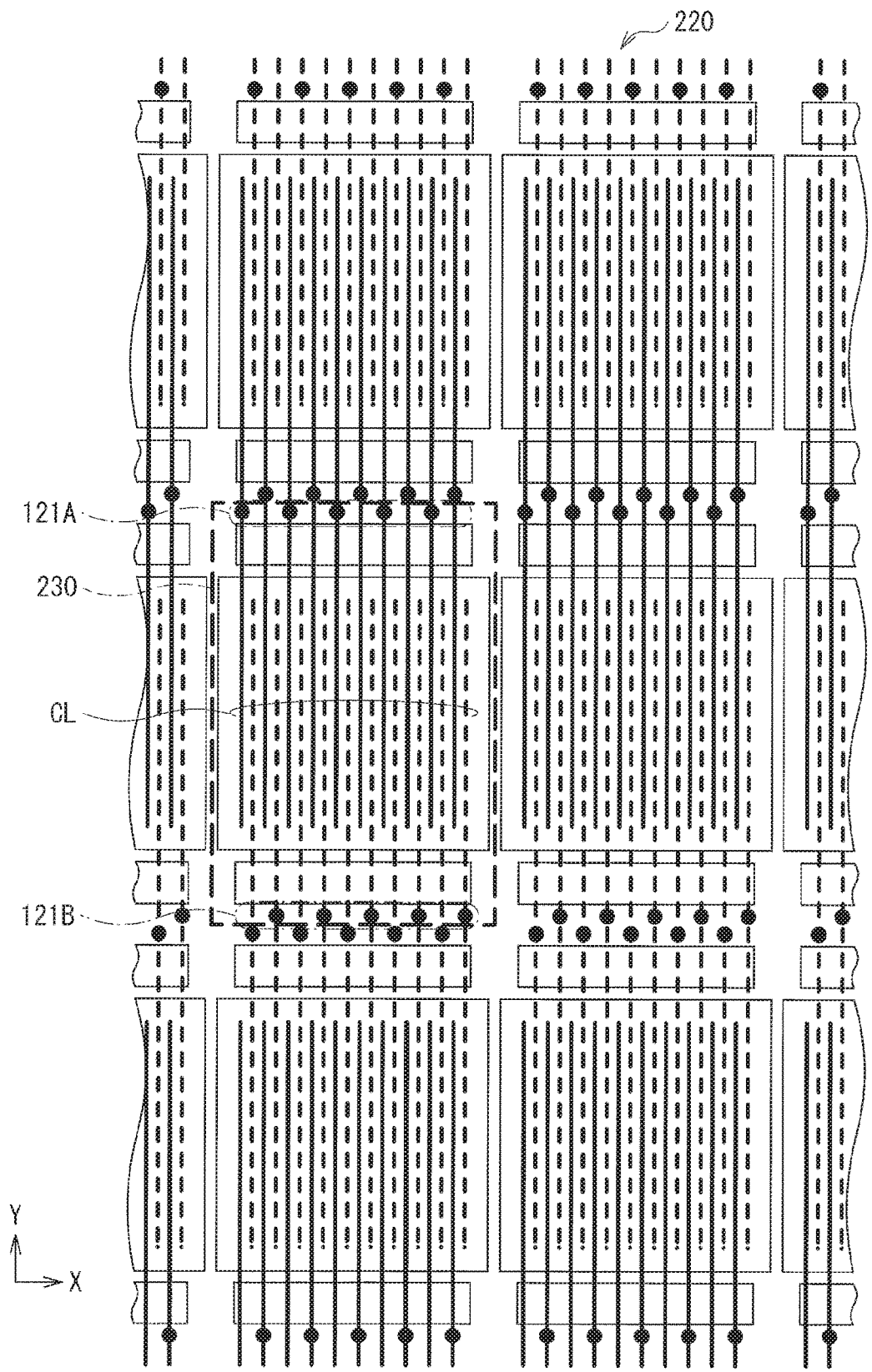

[ FIG. 24 ]
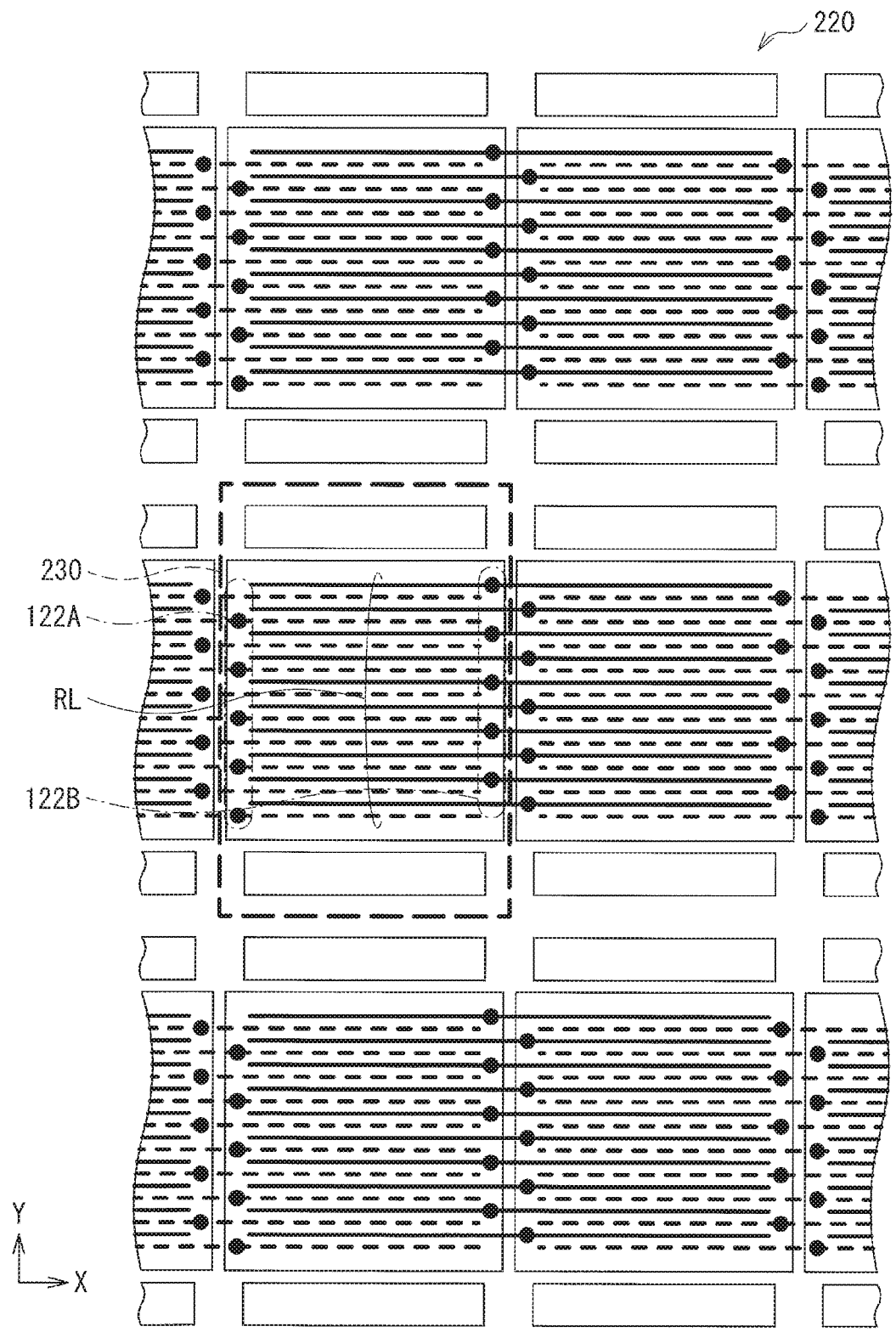

[FIG. 25]
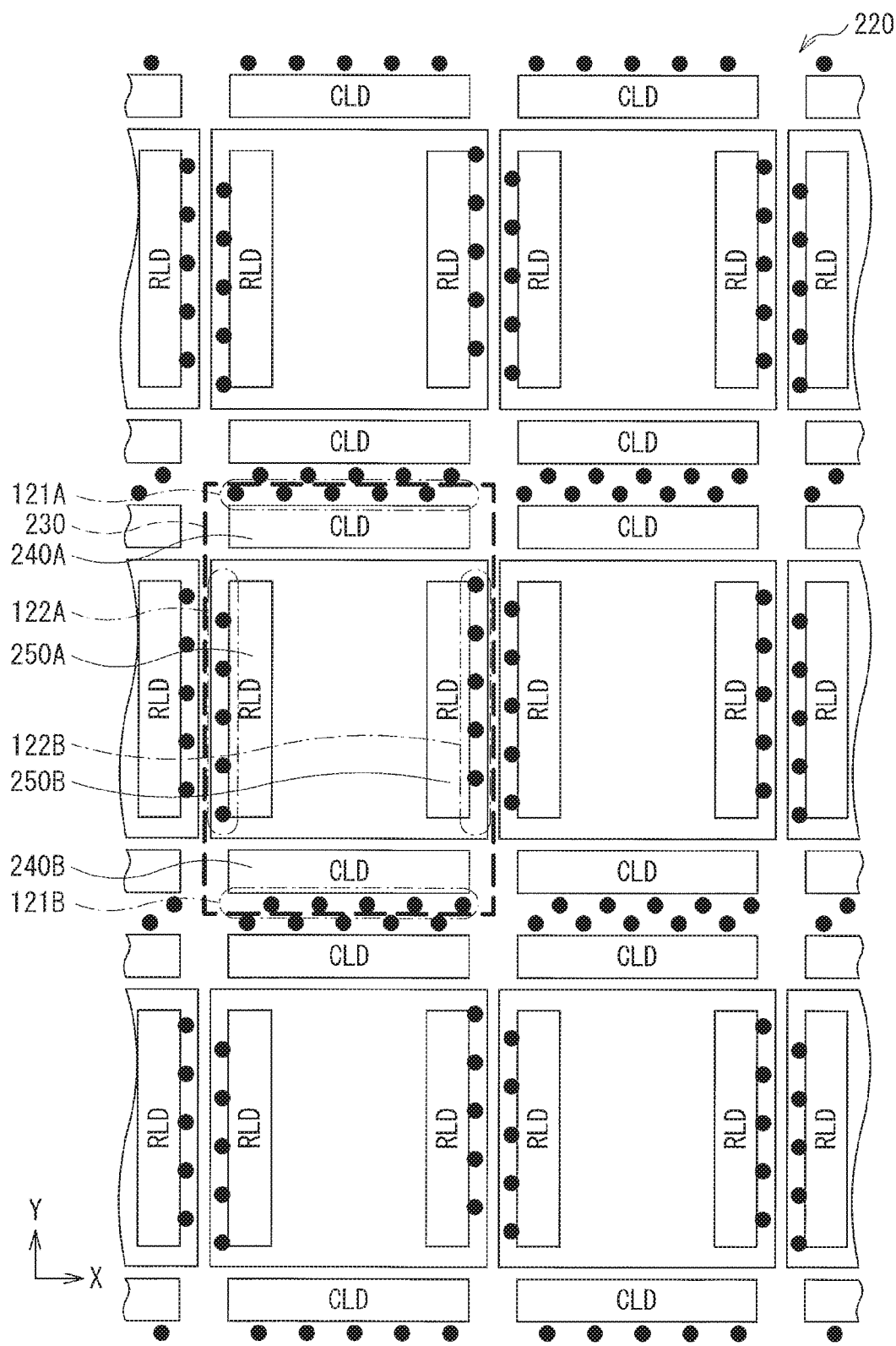

[FIG. 26]
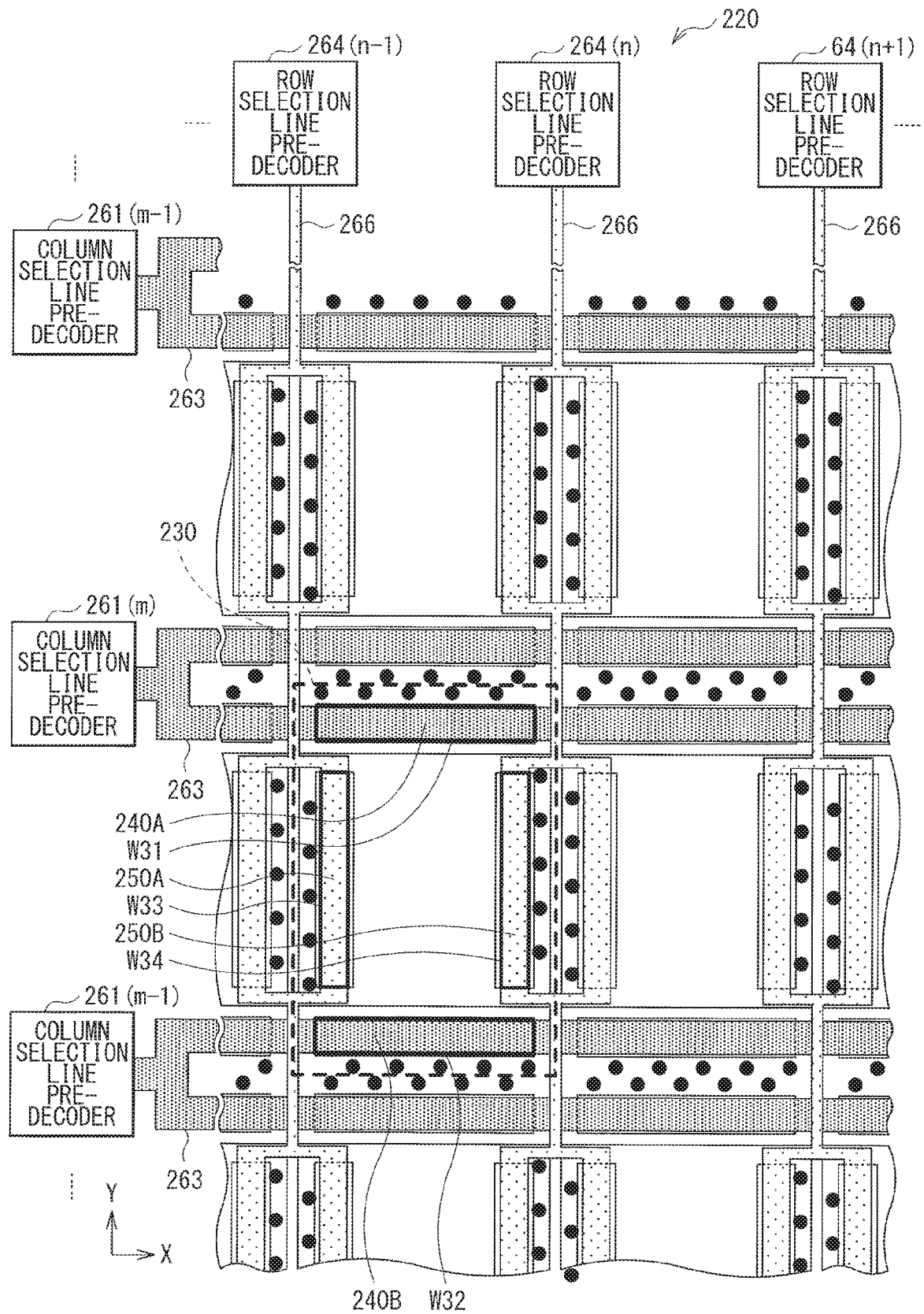

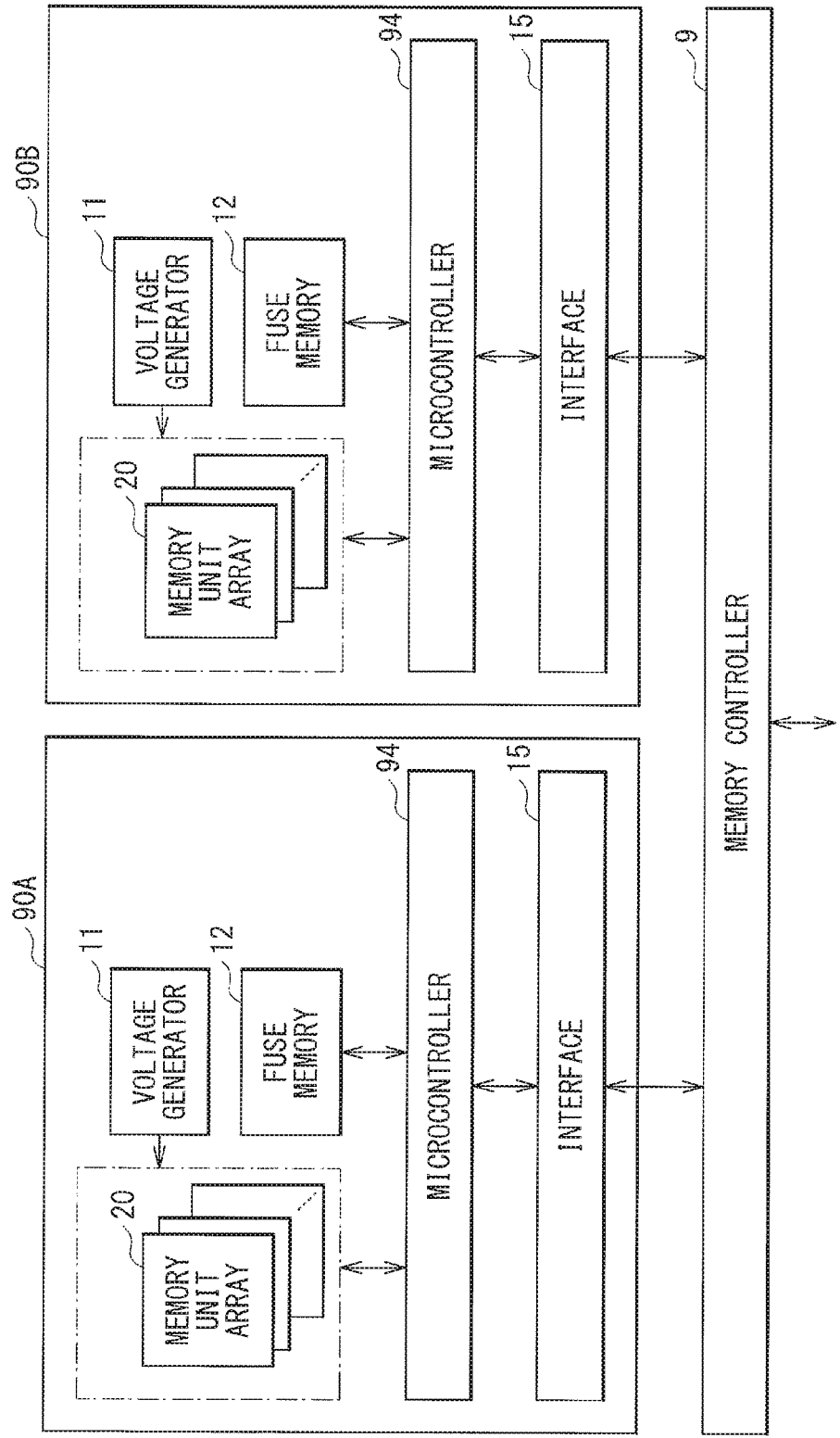
[FIG. 27]

STORAGE DEVICE FOR STORING DATA USING A RESISTIVE RANDOM ACCESS STORAGE ELEMENT

CROSS REFERENCE TO RELATED APPLICATIONS

This application is a U.S. National Phase of International Patent Application No. PCT/JP2018/009682 filed on Mar. 13, 2018, which claims priority benefit of Japanese Patent Application No. JP 2017-059523 filed in the Japan Patent Office on Mar. 24, 2017. Each of the above-referenced applications is hereby incorporated herein by reference in its entirety.

TECHNICAL FIELD

The present disclosure relates to a storage device that stores data.

BACKGROUND ART

In recent years, for example, much focus has been placed on a nonvolatile memory device using a resistive random access memory that allows for performance of faster data access than a flash memory. For such memory devices is used a technology of replacing a memory cell not operating normally with a spare memory cell, thereby repairing the memory cell not operating normally. For example, PTL 1 discloses a storage device including a redundancy region.

CITATION LIST

Patent Literature
PTL 1: Japanese Unexamined Patent Application Publication No. 2014-199705.

SUMMARY OF THE INVENTION

Meanwhile, ease of layout is desired in semiconductor circuits, and facilitating layout is expected in storage devices as well.

It is desirable to provide a storage device that makes it possible to facilitate layout.

A storage device according to an embodiment of the present disclosure includes a plurality of first wiring lines, a plurality of second wiring lines, a plurality of first memory cells, a first driver, and a second driver. The plurality of first wiring lines is provided in a first region, extends in a first direction, and includes a plurality of first selection lines and a plurality of second selection lines. The plurality of second wiring lines is provided in the first region, extends in a second direction intersecting the first direction, and includes a plurality of third selection lines and a plurality of fourth selection lines. The plurality of first memory cells is each inserted between a corresponding one of the plurality of first wiring lines and a corresponding one of the plurality of second wiring lines. The first driver includes a first selection line driver that drives the plurality of first selection lines on a basis of a first selection control signal and a second selection line driver that drives the plurality of second selection lines on a basis of the first selection control signal, the first selection line driver and the second selection line driver being arranged side-by-side in the first direction. The second driver includes a third selection line driver that drives the plurality of third selection lines on a basis of a second selection control signal and a fourth selection line driver that drives the plurality of fourth selection lines on a basis of the second selection control signal, the third selection line driver and the fourth selection line driver being arranged side-by-side in the second direction.

In the storage device according to the embodiment of the present disclosure, the first wiring lines extending in the first direction and the plurality of second wiring lines extending in the second direction are formed in the first region. The first wiring lines include the plurality of first selection lines and the plurality of second selection lines. The second wiring lines include the plurality of third selection lines and the plurality of fourth selection lines. The plurality of first memory cells is each inserted between the corresponding one of the plurality of first wiring lines and the corresponding one of the plurality of second wiring lines. The plurality of first selection lines is driven by the first selection line driver on the basis of the first selection control signal. The plurality of second selection lines is driven by the second selection line driver on the basis of the first selection control signal. The first selection line driver and the second selection line driver are arranged side-by-side in the first direction. The plurality of third selection lines is driven by the third selection line driver on the basis of the second selection control signal. The plurality of fourth selection lines is driven by the fourth selection line driver on the basis of the second selection control signal. The third selection line driver and the fourth selection line driver are arranged side-by-side in the second direction.

According to the storage device in the embodiment of the present disclosure, the first selection line driver that drives the plurality of first selection lines on the basis of the first selection control signal and the second selection line driver that drives the plurality of second selection lines on the basis of the first selection control signal are arranged side-by-side in the first direction, and the third selection line driver that drives the plurality of third selection lines on the basis of the second selection control signal and the fourth selection line driver that drives the plurality of fourth selection lines on the basis of the second selection control signal are arranged side-by-side in the second direction. This enables layout to be facilitated. It is to be noted that the effects described here are not necessarily limitative, and may have any of the effects described in the present disclosure.

BRIEF DESCRIPTION OF DRAWINGS

FIG. 1 is a block diagram that illustrates a configuration example of a memory system according to an embodiment of the present disclosure.

FIG. 2 is a configuration diagram that illustrates a configuration example of a memory unit array.

FIG. 3 is an explanatory diagram that illustrates a configuration example of an address register of a column selection line predecoder illustrated in FIG. 2.

FIG. 4 is an explanatory diagram that illustrates a configuration example of an address register of a row selection line predecoder illustrated in FIG. 2.

FIG. 5 is a perspective view that illustrates a configuration example of a memory unit illustrated in FIG. 2.

FIG. 6 is a circuit diagram that illustrates a configuration example of a memory cell illustrated in FIG. 5.

FIG. 7 is a characteristic diagram that illustrates a characteristic example of a storage element illustrated in FIG. 5.

FIG. 8 is an explanatory diagram that illustrates a configuration example of a column selection line illustrated in FIG. 5.

FIG. 9 is an explanatory diagram that illustrates a configuration example of a row selection line illustrated in FIG. 5.

FIG. 10 is a cross-sectional diagram that illustrates a configuration example of the memory unit array illustrated in FIG. 2.

FIG. 11 is a perspective view that illustrates a configuration example of the memory unit illustrated in FIG. 2.

FIG. 12 is an explanatory diagram that illustrates an example of a layout arrangement of a column selection line driver and a row selection line driver illustrated in FIG. 11.

FIG. 13 is an explanatory diagram that illustrates an example of coupling of the column selection line driver and the row selection line driver illustrated in FIG. 12 to a column selection line and a row selection line.

FIG. 14 is a block diagram that illustrates a configuration example of the column selection line driver illustrated in FIG. 11.

FIG. 15 is a circuit diagram that illustrates a configuration example of a 5-bit decoder illustrated in FIG. 14.

FIG. 16 is a block diagram that illustrates a configuration example of the row selection line driver illustrated in FIG. 11.

FIG. 17 is an explanatory diagram that illustrates an example of a layout arrangement of a column selection control line and a row selection control line.

FIG. 18 is an explanatory diagram that illustrates an example of a layout arrangement of a column selection control line and a row selection control line according to a modification example.

FIG. 19 is an explanatory diagram that illustrates a configuration example of a column selection line according to another modification example.

FIG. 20 is an explanatory diagram that illustrates a configuration example of a row selection line according to another modification example.

FIG. 21 is an explanatory diagram that illustrates an example of a layout arrangement of a column selection line driver and a row selection line driver according to another modification example.

FIG. 22 is an explanatory diagram that illustrates an example of a layout arrangement of a column selection control line and a row selection control line according to another modification example.

FIG. 23 is an explanatory diagram that illustrates a configuration example of a column selection line according to another modification example.

FIG. 24 is an explanatory diagram that illustrates a configuration example of a row selection line according to another modification example.

FIG. 25 is an explanatory diagram that illustrates an example of a layout arrangement of a column selection line driver and a row selection line driver according to another modification example.

FIG. 26 is an explanatory diagram that illustrates an example of a layout arrangement of a column selection control line and a row selection control line according to another modification example.

FIG. 27 is a block diagram that illustrates a configuration example of a memory system according to another modification example.

MODES FOR CARRYING OUT THE INVENTION

In the following, some embodiments of the present disclosure are described in detail with reference to the drawings.

CONFIGURATION EXAMPLE

FIG. 1 illustrates a configuration example of a memory system 1 including a storage device (memory unit array 20) according to an embodiment. The memory system 1 includes memory devices 10A and 10B and a memory controller 9. It is to be noted that the two memory devices 10A and 10B are provided in this example, but this is not limitative. For example, one memory device may be provided, or three or more memory devices may be provided.

Each of the memory devices 10A and 10B stores data, and is configured as a semiconductor memory die, for example. Each of the memory devices 10A and 10B includes a plurality of memory unit arrays 20, a voltage generator 11, a fuse memory 12, a nonvolatile memory 13, a microcontroller 14, and an interface 15.

The memory unit array 20 is a nonvolatile storage device that stores data using a resistive random access storage element. In each of the memory unit arrays 20, a plurality of memory units 30 is arranged as described below. The voltage generator 11 generates a plurality of selection voltages Vsel and a non-selection voltage Vinh to be used in the memory unit array 20.

The fuse memory 12 stores early failure information INF1 regarding each memory unit array 20. The early failure information INF1 is information regarding a failure in a memory cell MC that has occurred in manufacture, and includes information regarding a row address and a column address of the memory cell MC not operating normally. This early failure information INF1 is, for example, written by a memory tester (not illustrated) in a pre-shipment test in shipping the memory devices 10A and 10B, for example, or is written by the memory controller 9, for example, in a pre-shipment test in shipping the memory system 1.

The nonvolatile memory 13 stores late failure information INF2 in each memory unit array 20, and includes a flash memory or the like, for example. The late failure information INF2 is information regarding a failure in a memory cell MC that has occurred after the start of use by a user, and includes information regarding a row address and a column address of the memory cell MC not operating normally. This late failure information INF2 is written by the memory controller 9, for example.

The microcontroller 14 controls operation of the plurality of memory unit arrays 20, the fuse memory 12, and the nonvolatile memory 13. For example, the microcontroller 14 supplies, to the memory unit array 20, a mode signal MD for giving an instruction about an operation mode, such as a write mode and a read mode. Then, in the write mode, the microcontroller 14 supplies an address signal ADR and a data signal DT to the memory unit array 20. In addition, in the read mode, the microcontroller 14 supplies an address signal ADR to the memory unit array 20, and receives a data signal DT supplied from the memory unit array 20.

The interface 15 communicates with the memory controller 9.

The memory controller 9 controls operation of the memory devices 10A and 10B, and in response to a request from a host (not illustrated), instructs the memory devices 10A and 10B to perform data write operation or data read operation. The memory controller 9 has an ECC (Error Check and Correct) function, and detects and corrects errors in write data and read data, thereby increasing reliability of data that is stored in the memory system 1.

In addition, the memory controller 9 monitors the number of times correction has been made (number of times of correction) in this ECC function in units of memory cells MC, for example, and in a case where the number of times of correction in a certain memory cell MC exceeds a predetermined number of times, performs a data write test and a data read test on the memory cell MC. Then, in a case where data writing and data reading are not able to be performed normally on the memory cell MC, the memory controller 9 causes the nonvolatile memory 13 to store information regarding a row address and a column address of the memory cell MC, as late failure information INF2.

In addition, the memory controller 9 also has a function of reading early failure information INF1 stored in the fuse memory 12 and late failure information INF2 stored in the nonvolatile memory 13, when the memory system 1 is started, for example, and generating column address replacement information INFCL including information regarding a column address ADRCL to be replaced and row address replacement information INFRL including information regarding a row address ADRRL to be replaced, on the basis of these pieces of early failure information INF1 and late failure information INF2. Then, the memory controller 9 causes an address register 22 (described below) in the memory unit array 20 to store the column address replacement information INFCL, and causes an address register 25 (described below) in the memory unit array 20 to store the row address replacement information INFRL. Thus, the memory system 1 repairs a memory cell MC not operating normally by using these pieces of column address replacement information INFCL and row address replacement information INFRL, as described below.

FIG. 2 illustrates a configuration example of the memory unit array 20. The memory unit array 20 includes a plurality of column selection line predecoders 21, a plurality of row selection line predecoders 24, and the plurality of memory units 30.

In this example, 16 memory units 30 are disposed in an X-direction, and 16 memory units 30 are disposed in a Y-direction. In other words, in this example, the memory unit array 20 includes 256 (=16×16) memory units 30. In this example, the memory units 30 are alternately disposed in the Y-direction. Accordingly, 32 column selection line predecoders 21 are arranged side-by-side in the X-direction, and 16 row selection line predecoders 24 are arranged side-by-side in the Y-direction.

Each of the column selection line predecoders 21 generates a selection control signal SELCL, on the basis of a column address ADRCL included in an address signal ADR supplied from the microcontroller 14 and an enable signal ENB included in a mode signal MD. In this example, the column address ADRCL is 8-bit address information. The enable signal ENB is a signal that is set to "1" in a case of performing write operation or read operation, and is set to "0" in other cases. The plurality of column selection line predecoders 21 is supplied with the same column address ADRCL and enable signal ENB. Then, each of the column selection line predecoders 21 supplies the generated selection control signal SELCL, through a column selection control line 23 extending in the Y-direction, to column selection line drivers (CLDs) 40 (described below) of a plurality of (in this example, eight) memory units 30 coupled to the column selection control line 23.

Each of the column selection line predecoders 21 includes the address register 22. The address register 22 stores column address replacement information INFCL supplied from the memory controller 9. The column address replacement information INFCL stored in the column selection line predecoder 21 is individually set for each column selection line predecoder 21. Therefore, the column address replacement information INFCL stored in each of the column selection line predecoders 21 is usually different from each other.

FIG. 3 illustrates a configuration example of the address register 22. In this example, the address register 22 includes four registers 22A (registers 22A(1) to 22A(4)). Each of the registers 22A is a 9-bit register, and is able to store a 1-bit repair flag FLG and an 8-bit column address ADRCL. The repair flag FLG is a flag indicating whether the row selection line predecoder 24 compares a supplied column address ADRCL with a column address ADRCL stored in the register 22A. These four registers 22A are respectively associated with four spare column selection lines CL described below.

Thus, in a case where the enable signal ENB is "1", each of the column selection line predecoders 21 checks the repair flags FLG of the four registers 22A. Then, in a case where all the repair flags FLG of the four registers 22A are "0", the column selection line predecoder 21 generates a selection control signal SELCL to cause the memory unit 30 to select a column selection line CL corresponding to the supplied column address ADRCL out of a plurality of (in this example, 256) column selection lines CL (described below). In addition, in a case where at least one of the repair flags FLG of the four registers 22A is "1", the column selection line predecoder 21 compares the supplied column address ADRCL with the column address ADRCL stored in the register 22A in which the repair flag FLG is set to "1". Then, in a case where these column addresses ADRCL do not match, the column selection line predecoder 21 generates a selection control signal SELCL to cause the memory unit 30 to select a column selection line CL corresponding to the supplied column address ADRCL out of the plurality of column selection lines CL. In addition, in a case where these column addresses ADRCL match each other, the column selection line predecoder 21 generates a selection control signal SELCL to cause the memory unit 30 to select a spare column selection line CL associated with the register 22A. That is to say, the column selection line CL related to the supplied column address ADRCL is replaced with the spare column selection line CL. In addition, in a case where the enable signal ENB is "0", each of the column selection line predecoders 21 generates a selection control signal SELCL to cause the memory unit 30 to select none of the plurality of column selection lines CL.

Each of the row selection line predecoders 24 generates a selection control signal SELRL, on the basis of a row address ADRRL included in an address signal ADR supplied from the microcontroller 14 and an enable signal ENB included in a mode signal MD. In this example, the row address ADRRL is 10-bit address information. The plurality of row selection line predecoders 24 is supplied with the same row address ADRRL and enable signal ENB. Then, each of the row selection line predecoders 24 supplies the generated selection control signal SELRL, through a row selection control line 26 extending in the X-direction, to row selection line drivers (RLDs) 50 (described below) of a plurality of (in this example, 16) memory units 30 coupled to the row selection control line 26.

Each of the row selection line predecoders 24 includes the address register 25. The address register 25 stores row address replacement information INFRL supplied from the memory controller 9. The row address replacement information INFRL stored in the row selection line predecoder 24 is individually set for each row selection line predecoder 24. Therefore, the row address replacement information INFRL stored in each of the row selection line predecoders 24 is usually different from each other.

FIG. 4 illustrates a configuration example of the address register 25. In this example, the address register 25 includes 16 registers 25A (registers 25A(1) to 25A(16)). Each of the registers 25A is a 11-bit register, and is able to store a 1-bit repair flag FLG and a 10-bit row address ADRRL. These 16 registers are respectively associated with 16 spare row selection lines RL described below.

Thus, in a case where the enable signal ENB is "1", each of the row selection line predecoders 24 checks the repair flags FLG of the 16 registers 25A. Then, in a case where all the repair flags FLG of the 16 registers 25A are "0", the row selection line predecoder 24 generates a selection control signal SELRL to cause the memory unit 30 to select a row selection line RL corresponding to the supplied row address ADRRL out of a plurality of (in this example, 1024) row selection lines RL (described below). In addition, in a case where at least one of the repair flags FLG of the 16 registers 25A is "1", the row selection line predecoder 24 compares the supplied row address ADRRL with the row address ADRRL stored in the register 25A in which the repair flag FLG is set to "1". Then, in a case where these row addresses ADRRL do not match, the row selection line predecoder 24 generates a selection control signal SELRL to cause the memory unit 30 to select a row selection line RL corresponding to the supplied row address ADRRL out of the plurality of row selection lines RL. In addition, in a case where these row addresses ADRRL match each other, the row selection line predecoder 24 generates a selection control signal SELRL to cause the memory unit 30 to select a spare row selection line RL associated with the register 25A. That is to say, the row selection line RL related to the supplied row address ADRRL is replaced with the spare row selection line RL. In addition, in a case where the enable signal ENB is "0", each of the row selection line predecoders 24 generates a selection control signal SELRL to cause the memory unit 30 to select none of the plurality of row selection lines RL.

With this configuration, the plurality of column selection line predecoders 21 each generates a selection control signal SELCL on the basis of a supplied column address ADRCL, and the plurality of row selection line predecoders 24 each generates a selection control signal SELRL on the basis of a supplied row address ADRRL. Thus, in each of the plurality of (in this example, 256) memory units 30, a column selection line CL (described below) and a row selection line RL (described below) are selected. As a result, in the memory unit array 20, write operation and read operation are able to be performed on 256 memory cells MC as described below. In other words, the memory unit array 20 functions as a storage device with an access unit of 256 bits.

Each of the memory units 30 (FIG. 2) performs data write operation and data read operation on the basis of a selection control signal SELCL supplied from the column selection line predecoder 21 through the column selection control line 23, a selection control signal SELRL supplied from the row selection line predecoder 24 through the row selection control line 26, and a data signal DT and a mode signal MD supplied from the microcontroller 14.

FIG. 5 illustrates a configuration example of the memory unit 30. The memory unit 30 is a so-called cross-point type memory unit. The memory unit 30 includes a plurality of row selection lines RL (row selection lines RL1 and RL2), a plurality of column selection lines CL, and a plurality of memory cells MC.

The plurality of row selection lines RL1 is formed to extend in the X-direction in an X-Y plane parallel to a substrate surface S of a semiconductor substrate. The plurality of column selection lines CL is formed to extend in the Y-direction in this X-Y plane. The plurality of row selection lines RL2 is formed to extend in the X-direction in this X-Y plane. The plurality of column selection lines CL is formed in a layer above the layer in which the plurality of row selection lines RL1 is formed. The plurality of row selection lines RL2 is formed in a layer above the layer in which the plurality of column selection lines CL is formed. Thus, in the memory unit 30, the layer in which the row selection lines RL are formed and the layer in which the column selection lines CL are formed are alternately disposed.

In a storage layer interposed between the layer in which the plurality of row selection lines RL1 is formed and the layer in which the plurality of column selection lines CL is formed, a plurality of memory cells MC (memory cells MC1) is formed. Likewise, in a layer interposed between the layer in which the plurality of column selection lines CL is formed and the storage layer in which the plurality of row selection lines RL2 is formed, a plurality of memory cells MC (memory cells MC2) is formed.

FIG. 6 illustrates a configuration example of the memory cell MC. The memory cell MC includes a storage element VR, a selection element SE, and terminals TU and TL.

The storage element VR is a resistive random access storage element with a resistance state RS that changes reversibly in accordance with a polarity of a voltage difference between voltages applied to both ends. In other words, the resistance state RS of the storage element VR changes reversibly in accordance with a direction of a current flowing between both ends. For the storage element VR, for example, it is possible to use a stack of an ion source layer and a resistance change layer. The storage element VR has one end coupled to the terminal TU of the memory cell MC, and another end coupled to one end of the selection element SE.

FIG. 7 schematically illustrates a distribution of a resistance value of the storage element VR. The storage element VR possibly takes two identifiable resistance states RS (a high resistance state HRS and a low resistance state LRS). In this example, the high resistance state HRS corresponds to data "0", and the low resistance state LRS corresponds to data "1", for example. In other words, the storage element VR functions as a storage element that stores one-bit data. For example, causing a change from the high resistance state HRS to the low resistance state LRS is referred to as "set", and causing a change from the low resistance state LRS to the high resistance state HRS is referred to as "reset".

The selection element SE (FIG. 6) has bidirectional diode characteristics. Specifically, the selection element SE becomes conductive (on-state) in a case where an absolute value of the voltage difference between the voltages applied to both ends is larger than a predetermined voltage difference, and becomes nonconductive (off-state) in a case where the absolute value of the voltage difference is smaller than the predetermined voltage difference. The selection element SE has the one end coupled to the other end of the storage element VR, and another end coupled to the TL terminal of the memory cell MC.

The terminal TU is a terminal coupled to a selection line above a storage layer in which the memory cell MC is formed, and the terminal TL is a terminal coupled to a selection line below the storage layer in which the memory cell MC is formed. Specifically, as illustrated in FIG. 5, in the memory cell MC1, the terminal TU is coupled to one of the plurality of column selection lines CL, and the terminal TL is coupled to one of the plurality of row selection lines RL1. Likewise, in the memory cell MC2, the terminal TU is coupled to one of the plurality of row selection lines RL2, and the terminal TL is coupled to one of the plurality of column selection lines CL. Thus, in the memory cell MC, as illustrated in FIG. 5, the storage element VR is formed above the selection element SE, irrespective of which storage layer the memory cell MC is formed in.

In a case of setting the memory cell MC, a selection voltage (for example, 6 V) is applied to the terminal TU and a selection voltage (for example, 0 V) is applied to the terminal TL. This turns on the selection element SE to cause a set current Iset to flow from the terminal TU to the terminal TL, thus setting the storage element VR. In a case of resetting the memory cell MC, a selection voltage (for example, 6 V) is applied to the terminal TL and a selection voltage (for example, 0 V) is applied to the terminal TU. This turns on the selection element SE to cause a reset current Irst to flow from the terminal TL to the terminal TU, thus resetting the storage element VR. In addition, in a case of performing the read operation on the memory cell MC, a selection voltage (for example, 5 V) is applied to the terminal TU and a selection voltage (for example, 1 V) is applied to the terminal TL. This causes a sense current Isns to flow from the terminal TU to the terminal TL. Then, a sense amplifier 34 (described below) detects a voltage generated in the memory cell MC, thereby determining the resistance state RS of the storage element VR.

FIG. 8 illustrates an example of column selection lines CL in the memory unit array 20. Each of the column selection lines CL is formed across two memory units 30 adjacent to each other in the Y-direction. Each of the column selection lines CL is coupled to the column selection line driver (CLD) 40 (described below) formed on the semiconductor substrate, through one of connections 101A and 101B provided close to respective two sides (upper side and lower side in FIG. 8) of the memory unit 30 that are opposed in the Y-direction. In the memory unit 30, column selection lines CL adjacent to each other in the X-direction are coupled to the column selection line driver (CLD) 40 (described below) through different connections out of the connections 101A and 101B. In this example, since the memory units 30 are alternately disposed in the Y-direction, no column selection line CL is formed near the middle of the memory unit 30. In other words, the middle of a certain memory unit 30 in the X-direction corresponds to the boundary of a memory unit 30 adjacent in the Y-direction; hence, no column selection line CL is formed near the middle of the memory unit 30.

In one memory unit 30, for example, 1040 column selection lines CL are disposed. These 1040 column selection lines CL include 1024 column selection lines CL used in usual operation, and 16 spare column selection lines CL. In this case, the number of the column selection lines CL coupled to the connection 101A is 260 (=256+4), and likewise, the number of the column selection lines CL coupled to the connection 101B is 260 (=256+4).

FIG. 9 illustrates an example of row selection lines RL1 in the memory unit array 20. It is to be noted that the same applies to row selection lines RL2. Each of the row selection lines RL1 is formed in the memory unit 30. Each of the row selection lines RL is coupled to the row selection line driver (RLD) 50 (described below) formed on the semiconductor substrate, through one of connections 102A and 102B provided close to respective two sides (left side and right side in FIG. 9) of the memory unit 30 that are opposed in the X-direction. In the memory unit 30, row selection lines RL1 adjacent to each other in the Y-direction are coupled to the row selection line driver (RLD) 50 (described below) through different connections out of the connections 102A and 102B.

In one memory unit 30, for example, 1040 row selection lines RL1 and 1040 row selection lines RL2 are disposed. The 1040 row selection lines RL1 include 1024 row selection lines RL1 used in usual operation, and 16 spare row selection lines RL1. Likewise, the 1040 row selection lines RL2 include 1024 row selection lines RL2 used in usual operation, and 16 spare row selection lines RL2. In this case, the number of the row selection lines RL (row selection lines RL1 and RL2) coupled to the connection 102A is 1040 (=1024+16), and likewise, the number of the row selection lines RL coupled to the connection 102A is 1040 (=1024+16).

FIG. 10 schematically illustrates a cross-sectional configuration of the memory unit array 20. The memory unit array 20 includes three selection wiring layers LRL1, LCL, and LRL2, and four wiring layers LM1 to LM4. The selection wiring layer LRL1 is a wiring layer in which the row selection line RL1 is formed, the selection wiring layer LCL is a wiring layer in which the column selection line CL is formed, and the selection wiring layer LRL2 is a wiring layer in which the row selection line RL2 is formed. The four wiring layers LM1 to LM4 are metal wiring layers, the wiring layer LM1 is mainly used for local wiring in a circuit, and the wiring layers LM2 and LM3 are mainly used for wiring between circuits. In addition, the wiring layer LM4 is used, for example, in a case of coupling the column selection line CL and the row selection line RL2 to a circuit formed on the semiconductor substrate, and in a case of coupling to the outside of the semiconductor memory die. These layers are formed on the semiconductor substrate, in the order of the wiring layer LM1, the wiring layer LM2, the wiring layer LM3, the selection wiring layer LRL1, the selection wiring layer LCL, the selection wiring layer LRL2, and the wiring layer LM4, with insulating layers individually interposed therebetween.

The connections 101A and 101B that couple the column selection line CL to the semiconductor substrate each include a contact CT that couples a transistor TR formed on the semiconductor substrate to a metal wiring line in the wiring layer LM1, a plurality of vias VA that couples a metal wiring line in the wiring layer LM1 to a metal wiring line in the wiring layer LM4, and a via VA that couples a metal wiring line in the wiring layer LM4 to the column selection line CL.

The connections 102A and 102B that couple the row selection line RL1 to the semiconductor substrate each include a contact CT that couples a transistor TR formed on the semiconductor substrate to a metal wiring line in the wiring layer LM1, and a plurality of vias VA that couples a metal wiring line in the wiring layer LM1 to the row selection line RL1.

It is to be noted that, although not illustrated, like the connections 101A and 101B, the connections 102A and 102B that couple the row selection line RL2 to the semiconductor substrate each include a contact CT that couples a transistor TR formed on the semiconductor substrate to a metal wiring line in the wiring layer LM1, a plurality of vias VA that couples a metal wiring line in the wiring layer LM1 to a metal wiring line in the wiring layer LM4, and a via VA that couples a metal wiring line in the wiring layer LM4 to the row selection line RL2.

Next, a circuit formed on the semiconductor substrate in the memory unit 30 is described in detail.

FIG. 11 illustrates a configuration example of the memory unit 30. The memory unit 30 includes a read/write circuit 31, the column selection line driver (CLD; CL Driver) 40, and the row selection line driver (RLD; RL Driver) 50.

The read/write circuit 31 controls data write operation and data read operation in the memory unit 30. The read/write circuit 31 includes a voltage selector 32, a current limiter 33, the sense amplifier 34, and a program latch 35. On the basis of a mode signal MD, a data signal DT, and information stored in the program latch 35, the voltage selector 32 selects another one of a plurality of selection voltages Vsel supplied from the voltage generator 11 and supplies the selected selection voltage Vsel, as a selection voltage VCL, to a column selection line CL selected by the column selection line driver (CLD) 40, and selects another one of the plurality of selection voltages Vsel supplied from the voltage generator 11 and supplies the selected selection voltage Vsel, as a selection voltage VRL, to a row selection line RL selected by the row selection line driver (RLD) 50. The current limiter 33 limits a current value of a current flowing through a selected memory cell MC coupled to the selected column selection line CL and the selected row selection line RL, on the basis of the mode signal MD. The sense amplifier 34 determines the resistance state RS of the selected memory cell MC, on the basis of the voltage of the selected column selection line CL or the selected row selection line RL. The program latch 35 stores various types of setting information.

In write operation and read operation, on the basis of a selection control signal SELCL, the column selection line driver (CLD) 40 supplies the selection voltage VCL supplied from the read/write circuit 31 to one of the plurality of column selection lines CL, and supplies the non-selection voltage Vinh to the rest of the column selection lines CL. The selection control signal SELCL is a logical signal, and includes control signals SELCA3[4:0] and SELCA3B[4:0], control signals SELCB3[4:0] and SELCB3B[4:0], control signals SELC2[7:0] and SELC2B[7:0], and control signals SELC1[7:0] and SELC1B[7:0]. The control signals SELCA3B[4:0] are inverted signals of the control signals SELCA3[4:0], the control signals SELCB3B[4:0] are inverted signals of the control signals SELCB3[4:0], the control signals SELC2B[7:0] are inverted signals of the control signals SELC2[7:0], and the control signals SELC1B[7:0] are inverted signals of the control signals SELC1[7:0].

The column selection line driver (CLD) 40 includes column selection line drivers (CLDs) 40A and 40B. The column selection line driver (CLD) 40A supplies voltage to 260 (=256+4) column selection lines CL coupled to the connection 101A, on the basis of the control signals SELCA3[4:0] and SELCA3B[4:0], the control signals SELC2[7:0] and SELC2B[7:0], and the control signals SELC1[7:0] and SELC1B[7:0]. The column selection line driver (CLD) 40B supplies voltage to 260 (=256+4) column selection lines CL coupled to the connection 101B, on the basis of the control signals SELCB3[4:0] and SELCB3B[4: 0], the control signals SELC2[7:0] and SELC2B[7:0], and the control signals SELC1[7:0] and SELC1B[7:0].

In write operation and read operation, on the basis of a selection control signal SELRL, the row selection line driver (RLD) 50 supplies the selection voltage VRL supplied from the read/write circuit 31 to one of the plurality of row selection lines RL, and supplies the non-selection voltage Vinh to the rest of the row selection lines RL. The selection control signal SELRL is a logical signal, and includes control signals SELRA3[8:0] and SELRA3B[8:0], control signals SELRB3[8:0] and SELRB3B[8:0], control signals SELR2[7:0] and SELR2B[7:0], and control signals SELR1 [15:0] and SELR1B[15:0]. The control signals SELRA3B [8:0] are inverted signals of the control signals SELRA3[8: 0], the control signals SELRB3B[8:0] are inverted signals of the control signals SELRB3[8:0], the control signals SELR2B[7:0] are inverted signals of the control signals SELR2[7:0], and the control signals SELR1B[15:0] are inverted signals of the control signals SELR1[15:0].

The row selection line driver (RLD) 50 includes row selection line drivers (RLDs) 50A and 50B. The row selection line driver (RLD) 50A supplies voltage to 1040 (=1024+16) row selection lines RL (row selection lines RL1 and RL2) coupled to the connection 102A, on the basis of the control signals SELRA3[8:0] and SELRA3B[8:0], the control signals SELR2[7:0] and SELR2B[7:0], and the control signals SELR1[15:0] and SELR1B[15:0]. The row selection line driver (RLD) 50B supplies voltage to 1040 (=1024+16) row selection lines RL (row selection lines RL1 and RL2) coupled to the connection 102B, on the basis of the control signals SELRB3[8:0] and SELRB3B[8:0], the control signals SELR2[7:0] and SELR2B[7:0], and the control signals SELR1[15:0] and SELR1B[15:0].

FIG. 12 illustrates an example of a layout arrangement of the column selection line drivers (CLDs) 40A and 40B and the row selection line drivers (RLDs) 50A and 50B in the memory unit 30. FIG. 13 illustrates coupling between the column selection lines CL and the column selection line drivers (CLDs) 40A and 40B, and coupling between the row selection lines RL and the row selection line drivers (RLDs) 50A and 50B. It is to be noted that, in FIG. 13, illustration of the row selection line RL2 coupled to the row selection line driver (RLD) 50A through the connection 102A is omitted, and illustration of the row selection line RL1 coupled to the row selection line driver (RLD) 50B through the connection 102B is omitted.

In this example, as illustrated in FIG. 12, the column selection line driver (CLD) 40A is disposed in a region close to the connection 101A, and the column selection line driver (CLD) 40B is disposed in a region close to the connection 101B. Thus, as illustrated in FIG. 13, the column selection lines CL coupled to the connection 101A are coupled to the column selection line driver (CLD) 40A through this connection 101A, and the column selection lines CL coupled to the connection 101B are coupled to the column selection line driver (CLD) 40B through this connection 101B.

In addition, as illustrated in FIG. 12, the row selection line driver (RLD) 50A is disposed in a region close to the connection 102A, and the row selection line driver (RLD) 50B is disposed in a region close to the connection 102B. Thus, as illustrated in FIG. 13, the row selection lines RL1 and RL2 coupled to the connection 102A are coupled to the row selection line driver (RLD) 50A through this connection 102A, and the row selection lines RL1 and RL2 coupled to the connection 102B are coupled to the row selection line driver (RLD) 50B through this connection 102B.

It is to be noted that, although not illustrated, in the memory unit 30, the read/write circuit 31 is disposed in a region surrounded by the column selection line drivers (CLDs) 40A and 40B and the row selection line drivers (RLDs) 50A and 50B.

FIG. 14 illustrates a configuration example of the column selection line driver (CLD) 40A. The column selection line driver (CLD) 40A includes one 5-bit decoder 41, four 8-bit decoders 42 (8-bit decoders 42(1) to 42(4)), thirty-two 8-bit decoders 43 (8-bit decoders 43(1) to 43(32)), and one 4-bit decoder 44.

The 5-bit decoder 41 has five output terminals. Out of the five output terminals, the 5-bit decoder 41 outputs the voltage (selection voltage VCL) input to the 5-bit decoder 41 from the output terminal corresponding to the control signals SELCA3[4:0] and SELCA3B[4:0], and outputs the non-selection voltage Vinh from the other four output terminals.

FIG. 15 illustrates a configuration example of the 5-bit decoder 41. The 5-bit decoder 41 includes one input terminal IN, five output terminals OUT0 to OUT4, and 10 transistors TR1 to TR10. The transistors TR1 to TR10 are n-type MOS (Metal Oxide Semiconductor) transistors. The transistor TR1 has a gate supplied with a control signal SELCA3[0], a source coupled to the input terminal IN, and a drain coupled to the output terminal OUT0. The transistor TR2 has a gate supplied with a control signal SELCA3B [0], a source supplied with the non-selection voltage Vinh, and a drain coupled to the output terminal OUT0. The transistor TR3 has a gate supplied with a control signal SELCA3B[1], a source supplied with the non-selection voltage Vinh, and a drain coupled to the output terminal OUT1. The transistor TR4 has a gate supplied with a control signal SELCA3[1], a source coupled to the input terminal IN, and a drain coupled to the output terminal OUT1. The transistor TR5 has a gate supplied with a control signal SELCA3[2], a source coupled to the input terminal IN, and a drain coupled to the output terminal OUT2. The transistor TR6 has a gate supplied with a control signal SELCA3B[2], a source supplied with the non-selection voltage Vinh, and a drain coupled to the output terminal OUT2. The transistor TR7 has a gate supplied with a control signal SELCA3B[3], a source supplied with the non-selection voltage Vinh, and a drain coupled to the output terminal OUT3. The transistor TR8 has a gate supplied with a control signal SELCA3[3], a source coupled to the input terminal IN, and a drain coupled to the output terminal OUT3. The transistor TR9 has a gate supplied with a control signal SELCA3[4], a source coupled to the input terminal IN, and a drain coupled to the output terminal OUT4. The transistor TR10 has a gate supplied with a control signal SELCA3B[4], a source supplied with the non-selection voltage Vinh, and a drain coupled to the output terminal OUT4.

With this configuration, for example, in a case where the control signal SELCA3[0] is "1" and all the control signals SELCA3[1], SELCA3[2], SELCA3[3], and SELCA3[4] are "0", the transistors TR1, TR3, TR6, TR7, and TR10 are turned on, and the transistors TR2, TR4, TR5, TR8, and TR9 are turned off. Thus, the 5-bit decoder 41 outputs the selection voltage VCL supplied to the input terminal IN from the output terminal OUT0, and outputs the non-selection voltage Vinh from the output terminals OUT1 to OUT4. In addition, for example, in a case where the control signal SELCA3[1] is "1" and all the control signals SELCA3[0], SELCA3[2], SELCA3[3], and SELCA3[4] are "0", the transistors TR2, TR4, TR6, TR7, and TR10 are turned on, and the transistors TR1, TR3, TR5, TR8, and TR9 are turned off. Thus, the 5-bit decoder 41 outputs the selection voltage VCL supplied to the input terminal IN from the output terminal OUT1, and outputs the non-selection voltage Vinh from the output terminals OUT0 and OUT2 to OUT4. The same applies to other cases.

It is to be noted that, in this example, the 5-bit decoder 41 includes n-type MOS transistors, but this is not limitative; p-type MOS transistors may be used, or both n-type MOS transistors and p-type MOS transistors may be used.

As illustrated in FIG. 14, the five output terminals of this 5-bit decoder 41 are respectively coupled to input terminals of the four 8-bit decoders 42 and an input terminal of the 4-bit decoder 44.

The 8-bit decoder 42 has eight output terminals. Out of the eight output terminals, the 8-bit decoder 42 outputs the voltage input to the 8-bit decoder 42 from the output terminal corresponding to the control signals SELC2[7:0] and SELC2B[7:0], and outputs the non-selection voltage Vinh from the other seven output terminals. The eight output terminals of the 8-bit decoder 42 are respectively coupled to input terminals of eight 8-bit decoders 43. Specifically, for example, the eight output terminals of the 8-bit decoder 42(1) are respectively coupled to the input terminals of the eight 8-bit decoders 43(1) to 43(8), the eight output terminals of the 8-bit decoder 42(2) are respectively coupled to the input terminals of the eight 8-bit decoders 43(9) to 43(16), the eight output terminals of the 8-bit decoder 42(3) are respectively coupled to the input terminals of the eight 8-bit decoders 43(17) to 43(24), and the eight output terminals of the 8-bit decoder 42(4) are respectively coupled to the input terminals of the eight 8-bit decoders 43(25) to 43(32).

The 8-bit decoder 43 has eight output terminals. Out of the eight output terminals, the 8-bit decoder 43 outputs the voltage input to the 8-bit decoder 43 from the output terminal corresponding to the control signals SELC1[7:0] and SELC1B[7:0], and outputs the non-selection voltage Vinh from the other seven output terminals. The 256 (=8× 32) output terminals of the thirty-two 8-bit decoders 43 are coupled to 256 column selection lines CL through the connection 101A.

The 4-bit decoder 44 has four output terminals. Out of the four output terminals, the 4-bit decoder 44 outputs the voltage input to the 4-bit decoder 44 from the output terminal corresponding to the control signals SELC1[3:0] and SELC1B[3:0], and outputs the non-selection voltage Vinh from the other three output terminals. In other words, the 4-bit decoder 44 operates using the control signals SELC1[3:0] and SELC1B[3:0], out of the control signals SELC1[7:0] and SELC1B[7:0] supplied to the 8-bit decoder 43. The four output terminals of this 4-bit decoder 44 are coupled to four spare column selection lines CL through the connection 101A.

The above description is given using the column selection line driver (CLD) 40A as an example, but the same applies to the column selection line driver (CLD) 40B. Like the column selection line driver (CLD) 40A, the column selection line driver (CLD) 40B includes one 5-bit decoder 41, four 8-bit decoders 42 (8-bit decoders 42(1) to 42(4)), thirty-two 8-bit decoders 43 (8-bit decoders 43(1) to 43(32)), and one 4-bit decoder 44. In the column selection line driver (CLD) 40B, the 5-bit decoder 41 is supplied with the control signals SELCB3[4:0] and SELCB3B[4:0]. Then, the 5-bit decoder 41 outputs the voltage (selection voltage VCL) input to the 5-bit decoder 41 from the output terminal corresponding to the control signals SELCB3[4:0] and SELCB3B [4:0], out of the five output terminals, and outputs the non-selection voltage Vinh from the other four output terminals.

This configuration enables the column selection line driver (CLD) 40 to, in write operation and read operation, on the basis of a selection control signal SELCL, supply the selection voltage VCL supplied from the read/write circuit 31 to a selected column selection line CL out of the plurality of column selection lines CL, and supply the non-selection voltage Vinh to column selection lines CL other than the selected column selection line CL.

It is to be noted that this is not limitative. The column selection lines CL other than the selected column selection line CL may be set to a floating state. Specifically, fixing the control signals SELCA3B [4:0], SELCB3B [4:0], SELC2B [7:0], and SELC1B[7:0] at "0" enables the column selection lines CL other than the selected column selection line CL to be set to a floating state.

FIG. 16 illustrates a configuration example of the row selection line driver (RLD) 50A. The row selection line driver (RLD) 50A includes one 9-bit decoder 51, eight 8-bit decoders 52 (8-bit decoders 52(1) to 52(8)), sixty-four 16-bit decoders 53 (16-bit decoders 53(1) to 53(64)), and one 16-bit decoder 54.

The 9-bit decoder 51 has nine output terminals. Out of the nine output terminals, the 9-bit decoder 51 outputs the voltage (selection voltage VRL) input to the 9-bit decoder 51 from the output terminal corresponding to the control signals SELRA3[8:0] and SELRA3B[8:0], and outputs the non-selection voltage Vinh from the other eight output terminals. The nine output terminals of this 9-bit decoder 51 are respectively coupled to input terminals of the eight 8-bit decoders 52 and an input terminal of the 16-bit decoder 54.

The 8-bit decoder 52 has eight output terminals. Out of the eight output terminals, the 8-bit decoder 52 outputs the voltage input to the 8-bit decoder 52 from the output terminal corresponding to the control signals SELR2[7:0] and SELR2B[7:0], and outputs the non-selection voltage Vinh from the other seven output terminals. The eight output terminals of the 8-bit decoder 52 are respectively coupled to input terminals of eight 16-bit decoders 53. Specifically, for example, the eight output terminals of the 8-bit decoder 42(1) are respectively coupled to the input terminals of the eight 16-bit decoders 53(1) to 53(8), and the eight output terminals of the 8-bit decoder 52(2) are respectively coupled to the input terminals of the eight 16-bit decoders 53(9) to 53(16). The same applies to the 8-bit decoders 52(3) to 52(7). Moreover, the eight output terminals of the 8-bit decoder 52(8) are respectively coupled to the input terminals of the eight 16-bit decoders 53(57) to 43(64).

The 16-bit decoder 53 has 16 output terminals. Out of the 16 output terminals, the 16-bit decoder 53 outputs the voltage input to the 16-bit decoder 53 from the output terminal corresponding to the control signals SELR1[15:0] and SELR1B[15:0], and outputs the non-selection voltage Vinh from the other 15 output terminals. The 1024 (=16×64) output terminals of the sixty-four 16-bit decoders 53 are coupled to 1024 row selection lines RL through the connection 102A.

The 16-bit decoder 54 has 16 output terminals. Out of the 16 output terminals, the 16-bit decoder 54 outputs the voltage input to the 16-bit decoder 54 from the output terminal corresponding to the control signals SELR1[15:0] and SELR1B[15:0], and outputs the non-selection voltage Vinh from the other 15 output terminals. The 16 output terminals of this 16-bit decoder 54 are coupled to 16 spare column selection lines CL through the connection 102A.

The above description is given using the row selection line driver (RLD) 50A as an example, but the same applies to the row selection line driver (RLD) 50B. Like the row selection line driver 50A (RLD), the row selection line driver (RLD) 50B includes one 9-bit decoder 51, eight 8-bit decoders 52 (8-bit decoders 52(1) to 52(8)), sixty-four 16-bit decoders 53 (16-bit decoders 53(1) to 53(64)), and one 16-bit decoder 54. In the row selection line driver (RLD) 50B, the 9-bit decoder 51 is supplied with the control signals SELRB3[8:0] and SELRB3B[8:0]. Then, the 9-bit decoder 51 outputs the voltage (selection voltage VCL) input to the 9-bit decoder 51 from the output terminal corresponding to the control signals SELRB3[8:0] and SELRB3B[8:0], out of the five output terminals, and outputs the non-selection voltage Vinh from the other eight output terminals.

This configuration enables the row selection line driver (RLD) 50 to, in write operation and read operation, on the basis of a selection control signal SELRL, supply the selection voltage VRL supplied from the read/write circuit 31 to a selected row selection line RL out of the plurality of row selection lines RL, and supply the non-selection voltage Vinh to row selection lines RL other than the selected row selection line RL.

It is to be noted that this is not limitative. The row selection lines RL other than the selected row selection line RL may be set to a floating state. Specifically, fixing the control signals SELRA3B[8:0], SELRB3B[8:0], SELR2B [7:0], and SELR1B[15:0] at "0" enables the row selection lines RL other than the selected row selection line RL to be set to a floating state.

With this configuration, in each memory unit 30, one column selection line CL is selected by the column selection line driver (CLD) 40 on the basis of the selection control signal SELCL, and one row selection line RL is selected by the row selection line driver (RLD) 50 on the basis of the selection control signal SELRL. The selection voltage VCL is applied to the selected column selection line CL, and the non-selection voltage Vinh is applied to the unselected column selection line CL. Likewise, the selection voltage VRL is applied to the selected row selection line RL, and the non-selection voltage Vinh is applied to the unselected row selection line RL. Thus, in a memory cell MC coupled to the selected row selection line RL and the selected column selection line CL, the selection voltages VCL and VRL are applied to both ends, and write operation (set or reset) or read operation is performed in accordance with these selection voltages VCL and VRL.

As illustrated in FIG. 2, the plurality of column selection line predecoders 21 each generates a selection control signal SELCL on the basis of a supplied column address ADRCL. Likewise, the plurality of row selection line predecoders 24 each generates a selection control signal SELRL on the basis of a supplied row address ADRRL. Thus, in each of the plurality of (in this example, 256) memory units 30, a column selection line CL and a row selection line RL are selected.

On that occasion, in a case where the address registers 22 store no column address replacement information INFCL, the plurality of column selection line predecoders 21 generates the same selection control signal SELCL, and in a case where the address registers 25 store no row address replacement information INFRL, the plurality of row selection line predecoders 24 generates the same selection control signal SELRL. Therefore, in this case, in the plurality of (in this example, 256) memory units 30, column selection lines CL at the same position are selected, and row selection lines RL at the same position are selected.

In addition, for example, in a case where the address register 22 of a certain column selection line predecoder 21 stores column address replacement information INFCL, and a column selection line CL related to a supplied column address ADRCL is to be replaced with a spare column selection line CL, replacement with a spare column selection line CL is performed in all (in this example, eight) the memory units 30 coupled to the column selection line predecoder 21.

Likewise, for example, in a case where the address register 25 of a certain row selection line predecoder 24 stores row address replacement information INFRL, and a row selection line RL related to a supplied row address ADRRL is to be replaced with a spare row selection line RL, replacement with a spare row selection line RL is performed in all (in this example, 16) the memory units 30 coupled to the row selection line predecoder 24.

Next, description is given on the column selection control lines 23 that couple the plurality of column selection line predecoders 21 to the plurality of memory units 30 and the row selection control lines 26 that couple the plurality of row selection line predecoders 24 to the plurality of memory units 30, in the memory unit array 20 (FIG. 2).

FIG. 17 illustrates a layout example of the column selection control lines 23 and the row selection control lines 26. As illustrated in FIG. 11, the column selection control line 23 transmits 52 control signals (control signals SELCA3[4:0], SELCA3B [4:0], SELCB3[4:0], SELCB3B[4:0], SELC2[7:0], SELC2B[7:0], SELC1[7:0], and SELC1B[7:0]) included in the selection control signal SELCL. In other words, the column selection control line 23 is so-called bus wiring including 52 wiring lines. Likewise, as illustrated in FIG. 11, the row selection control line 26 transmits 84 control signals (control signals SELRA3[8:0], SELRA3B[8:0], SELRB3[8:0], SELRB3B[8:0], SELR2[7:0], SELR2B[7:0], SELR1[15:0], and SELR1B[15:0]) included in the selection control signal SELRL. In other words, the row selection control line 26 is so-called bus wiring including 84 wiring lines.

The column selection control line 23 is formed using the wiring layers LM2 and LM3, for example. It is to be noted that, in the example of FIG. 10, the column selection control line 23 is formed using the wiring layer LM3. As illustrated in FIG. 17, the column selection control line 23 is disposed to pass near the middle of the memory unit 30 coupled to the column selection control line 23. In this memory unit 30, a region where the column selection control line 23 is formed overlaps regions where the column selection line drivers (CLDs) 40A and 40B are formed, in regions W1 and W2 surrounded by thick lines in FIG. 17. In the memory unit 30, the column selection control line 23 is coupled to the column selection line driver (CLD) 40A through a via VA and the like, in the region W1 in which the region where the column selection control line 23 is formed overlaps the region where the column selection line driver (CLD) 40A is formed. Likewise, in the memory unit 30, the column selection control line 23 is coupled to the column selection line driver (CLD) 40B through a via VA and the like, in the region W2 in which the region where the column selection control line 23 is formed overlaps the region where the column selection line driver (CLD) 40B is formed.

The row selection control line 26 is formed using the wiring layers LM2 and LM3, for example. It is to be noted that, in the example of FIG. 10, the column selection control line 23 is formed using the wiring layer LM3. As illustrated in FIG. 17, the row selection control line 26 is disposed to pass near the middle of the memory unit 30 coupled to the row selection control line 26. Hence, in this memory unit 30, a region where the row selection control line 26 is formed overlaps regions where the row selection line drivers (RLDs) 50A and 50B are formed, in regions W3 and W4 surrounded by thick lines in FIG. 17. In the memory unit 30, the row selection control line 26 is coupled to the row selection line driver (RLD) 50A through a via VA and the like, in the region W3 in which the region where the row selection control line 26 is formed overlaps the region where the row selection line driver (RLD) 50A is formed. Likewise, in the memory unit 30, the row selection control line 26 is coupled to the row selection line driver (RLD) 50B through a via VA and the like, in the region W4 in which the region where the row selection control line 26 is formed overlaps the region where the row selection line driver (RLD) 50B is formed.

In a region where the column selection control line 23 intersects the row selection control line 26, it is desirable to cause the column selection control line 23 and the row selection control line 26 to intersect each other by, for example, temporarily changing a layer in which the row selection control line 26 is formed from the wiring layers LM2 and LM3 to the wiring layer LM1.

On a path of the row selection control line 26 is formed a plurality of vias VA included in the connections 102A and 102B (FIGS. 10 and 12). In these connections 102A and 102B, 84 wiring lines of the row selection control line 26 pass through spaces between the plurality of vias VA included in the connections 102A and 102B. Hence, in the row selection control line 26, the number density of wiring lines in the Y-direction is made low. As a result, the row selection control line 26 is formed thick as illustrated in FIG. 17.

Meanwhile, on a path of the column selection control line 23, vias VA included in the connections 101A and 101B are not formed, which allows for a high number density of wiring lines in the X-direction. As a result, the column selection control line 23 is formed thin as illustrated in FIG. 17.

Here, the column selection line CL corresponds to a specific example of a "first wiring line" in the present disclosure. The row selection line RL corresponds to a specific example of a "second wiring line" in the present disclosure. The column selection line driver (CLD) 40 corresponds to a specific example of a "first driver" in the present disclosure. The selection control signal SELCL corresponds to a specific example of a "first selection control signal" in the present disclosure. The row selection line driver (RLD) 50 corresponds to a specific example of a "second driver" in the present disclosure. The selection control signal SELRL corresponds to a specific example of a "second selection control signal" in the present disclosure. The column selection line predecoder 21 corresponds to a specific example of a "first generator" in the present disclosure. The address register 22 corresponds to a specific example of a "first register" in the present disclosure. The column selection control line 23 corresponds to a specific example of a "first selection control line" in the present disclosure. The row selection line predecoder 24 corresponds to a specific example of a "second generator" in the present disclosure. The address register 25 corresponds to a specific example of a "second register" in the present disclosure. The column selection control line 26 corresponds to a specific example of a "second selection control line" in the present disclosure.

[Operations and Workings]

Next, operations and workings of the memory system 1 according to the present embodiment are described.

(Overview of Overall Operation)

First, an overview of an overall operation of the memory system 1 is described with reference to FIGS. 1, 2, and 11. The memory controller 9 (FIG. 1) controls operation of the memory devices 10A and 10B, and in response to a request from a host, instructs the memory devices 10A and 10B to perform data write operation or data read operation. For example, the microcontroller 14 of the memory device 10A controls operation of the plurality of memory unit arrays 20, the fuse memory 12, and the nonvolatile memory 13. For example, the microcontroller 14 supplies, to the memory unit array 20, a mode signal MD for giving an instruction about an operation mode, such as a write mode and a read mode. Then, in the write mode, the microcontroller 14 supplies an address signal ADR and a data signal DT to the memory unit array 20. In addition, in the read mode, the microcontroller 14 supplies an address signal ADR to the memory unit array 20, and receives a data signal DT supplied from the memory unit array 20.

In the memory unit array 20 (FIG. 2), each of the column selection line predecoders 21 generates a selection control signal SELCL, on the basis of a column address ADRCL included in an address signal ADR supplied from the microcontroller 14 and an enable signal ENB included in a mode signal MD. Each of the row selection line predecoders 24 generates a selection control signal SELRL, on the basis of a row address ADRRL included in an address signal ADR supplied from the microcontroller 14 and an enable signal ENB included in a mode signal MD.

Each of the memory units 30 performs data write operation and data read operation on the basis of a selection control signal SELCL supplied from the column selection line predecoder 21 through the column selection control line 23, a selection control signal SELRL supplied from the row selection line predecoder 24 through the row selection control line 26, and a data signal DT and a mode signal MD supplied from the microcontroller 14. Specifically, the read/write circuit 31 (FIG. 11) generates the selection voltages VCL and VRL on the basis of the mode signal MD, the data signal DT, and information stored in the program latch 35, for example. In addition, in read operation, the read/write circuit 31 determines the resistance state RS of the selected memory cell MC on the basis of the voltage of the selected column selection line CL or the selected row selection line RL. In write operation and read operation, on the basis of a selection control signal SELCL, the column selection line driver (CLD) 40 supplies the selection voltage VCL supplied from the read/write circuit 31 to one of the plurality of column selection lines CL, and supplies the non-selection voltage Vinh to the rest of the column selection lines CL. In write operation and read operation, on the basis of a selection control signal SELRL, the row selection line driver (RLD) 50 supplies the selection voltage VRL supplied from the read/write circuit 31 to one of the plurality of row selection lines RL, and supplies the non-selection voltage Vinh to the rest of the row selection lines RL.

(Detailed Operation)

In the memory unit 30, as illustrated in FIG. 5, the plurality of row selection lines RL (row selection lines RL1 and RL2), the plurality of column selection lines CL, and the plurality of memory cells MC are formed. In such a memory unit 30, for example, the following three failure cases are assumed. The first case is a case where a trouble such as a break occurs in a column selection line CL. In this case, the memory system 1 is not able to perform write operation and read operation on a plurality of memory cells MC coupled to the column selection line CL. The second case is a case where a trouble such as a break occurs in a row selection line RL. In this case, the memory system 1 is not able to perform write operation and read operation on a plurality of memory cells MC coupled to the row selection line RL. The third case is a case where a trouble occurs only in a certain memory cell MC. In this case, the memory system 1 is not able to perform write operation and read operation on the memory cell MC.

The memory system 1 solves such a failure by using a spare column selection line CL and a spare row selection line RL. Specifically, in the first case, a column selection line CL in which a trouble has occurred is replaced with a spare column selection line CL. In the second case, a row selection line RL in which a trouble has occurred is replaced with a spare row selection line RL. In the third case, one of a column selection line CL and a row selection line RL coupled to a memory cell MC in which a trouble has occurred is replaced with a spare selection line.

In the memory system 1, for example, early failure information INF1 is stored in the fuse memory 12, and late failure information INF2 is stored in the nonvolatile memory 13. When the memory system 1 is started, for example, the memory controller 9 generates column address replacement information INFCL including information regarding a column address ADRCL to be replaced and row address replacement information INFRL including information regarding a row address ADRRL to be replaced, on the basis of these pieces of early failure information INF1 and late failure information INF2. Then, the memory controller 9 supplies the generated column address replacement information INFCL to the address register 22 of the column selection line predecoder 21, and supplies the generated row address replacement information INFRL to the address register 25 of the row selection line predecoder 24.

For example, in a case (the first case) where early failure information INF1 indicates that a trouble has occurred in a certain column selection line CL of a certain memory unit 30 (memory unit 301), the memory controller 9 generates column address replacement information INFCL on the basis of the early failure information INF1, and supplies the column address replacement information INFCL to the column selection line predecoder 21 coupled to the memory unit 301. Likewise, for example, in a case (the second case) where late failure information INF2 indicates that a trouble has occurred in a certain row selection line RL of a certain memory unit 30 (memory unit 302), the memory controller 9 generates row address replacement information INFRL on the basis of the late failure information INF2, and supplies the row address replacement information INFRL to the row selection line predecoder 24 coupled to the memory unit 302.

For example, in a case (the third case) where late failure information INF2 indicates that a trouble has occurred in a certain memory cell MC of a certain memory unit 30 (memory unit 303), the memory controller 9 generates column address replacement information INFCL or row address replacement information INFRL on the basis of the late failure information INF2. In other words, in this third case, there are two possible methods: a method of replacing a column selection line CL coupled to the memory cell MC in which a trouble has occurred with a spare column selection line CL, and a method of replacing a row selection line RL coupled to the memory cell MC in which a trouble has occurred with a spare row selection line RL. In this case, for example, one of the two methods may be selected in consideration of availability of the address register 22 that stores column address replacement information INFCL and the address register 25 that stores row address replacement information INFRL. In other words, in this example, column address replacement information INFCL is able to include four column addresses ADRCL as illustrated in FIG. 3, and row address replacement information INFRL is able to include 16 row addresses ADRRL as illustrated in FIG. 4; hence, for example, in a case where many row addresses ADRRL are available, a row selection line RL coupled to the memory cell MC in which a trouble has occurred may be replaced with a spare row selection line RL. In this case, the memory controller 9 generates row address replacement information INFRL, and supplies the row address replacement information INFRL to the row selection line predecoder 24 coupled to the memory unit 303.

In a case where a supplied column address ADRCL is included in column address replacement information INFCL, each of the column selection line predecoders 21 replaces a column selection line CL related to the supplied column address ADRCL with a spare column selection line CL. Thus, replacement with a spare column selection line CL is performed in all (in this example, eight) the memory units 30 coupled to the column selection line predecoder 21.

Likewise, in a case where a supplied row address ADRRL is included in row address replacement information INFRL, each of the row selection line predecoders 24 replaces a row selection line RL related to the supplied row address ADRRL with a spare row selection line RL. Thus, replacement with a spare row selection line RL is performed in all (in this example, 16) the memory units 30 coupled to the row selection line predecoder 24.

Thus, in the memory system 1, providing a spare column selection line CL and a spare row selection line RL enables a memory cell not operating normally to be repaired, which makes it possible to increase reliability.

In addition, in the memory system 1, replacement is performed in units of column selection lines CL or in units of row selection lines RL, which enables a circuit configuration to be simplified. In other words, for example, in a case of performing replacement in units of memory cells MC, replacement is to be performed on the basis of both a row address and a column address, for example, which may possibly complicate the circuit configuration. In addition, for example, in the first case and the second case described above, replacement is to be performed for a large number of memory cells MC, which increases a size of a register, for example. In contrast, in the memory system 1, replacement is performed in units of column selection lines CL or in units of row selection lines RL, which enables the size of the register to be suppressed, for example, and the circuit configuration to be simplified.

In addition, in the memory system 1, as illustrated in FIG. 17, the plurality of column selection line predecoders 21 is disposed at an end in the Y-direction (upper side in FIG. 17), and the plurality of row selection line predecoders 24 is disposed at an end in the X-direction (left side in FIG. 17). In other words, in the memory system 1, the plurality of column selection line predecoders 21 and the plurality of row selection line predecoders 24 are disposed at different ends. Thus, in the memory system 1, the column selection control lines 23 and the row selection control lines 26 are distributed, as compared with a case of arranging both the plurality of column selection line predecoders 21 and the plurality of row selection line predecoders 24 at the same end, for example. This enables concerns for congestion of these wiring lines to be reduced, and consequently enables layout to be facilitated.

In addition, in the memory system 1, as illustrated in FIG. 17, the column selection control line 23 is formed to extend in the Y-direction, and the row selection control line 26 is formed to extend in the X-direction. Thus, in the memory system 1, the extending direction of the column selection control line 23 and the extending direction of the row selection control line 26 are made to intersect each other, which enables crosstalk between the column selection control line 23 and the row selection control line 26 to be suppressed. As a result, in the memory system 1, stability of operation is able to be increased, which enables reliability to be increased.

In addition, in the memory system 1, as illustrated in FIG. 12, the two column selection line drivers (CLD) 40A and 40B are disposed to be opposed to each other in the Y-direction, and the two row selection line drivers (RLD) 50A and 50B are disposed to be opposed to each other in the X-direction, in each memory unit 30. Thus, in the memory system 1, as illustrated in FIG. 17, the column selection control line 23 is able to be easily coupled to the two column selection line drivers (CLD) 40A and 40B, and the row selection control line 26 is able to be easily coupled to the two row selection line drivers (RLD) 50A and 50B, which consequently enables layout to be facilitated.

In addition, in the memory system 1, as illustrated in FIG. 17, each of the column selection control lines 23 is coupled to a plurality of (in this example, 8) memory units 30, and each of the row selection control lines 26 is coupled to a plurality of (in this example, 16) memory units 30. Thus, in the memory system 1, it is possible to reduce the number of wiring lines of the column selection control line 23 and the row selection control line 26, which enables concerns for congestion of the wiring lines to be reduced, and consequently enables layout to be facilitated.

[Effects]

As described above, in the present embodiment, providing a spare column selection line and a spare row selection line enables a memory cell not operating normally to be repaired, which makes it possible to increase reliability.

In the present embodiment, replacement is performed in units of column selection lines or in units of row selection lines, which enables a circuit configuration to be simplified.

In the present embodiment, the plurality of column selection line predecoders and the plurality of row selection line predecoders are disposed at different ends, which enables concerns for congestion of the wiring lines to be reduced, and consequently enables layout to be facilitated.

In the present embodiment, the extending direction of the column selection control line and the extending direction of the row selection control line are made to intersect each other, which enables crosstalk between the column selection control line and the row selection control line to be suppressed. This enables reliability to be increased.

In the present embodiment, two column selection line drivers are disposed to be opposed to each other in the Y-direction, and two row selection line drivers are disposed to be opposed to each other in the X-direction, in each memory unit. This enables the column selection control line to be easily coupled to the two column selection line drivers, and enables the row selection control line to be easily coupled to the two row selection line drivers, which consequently enables layout to be facilitated.

In the present embodiment, each of the column selection control lines is coupled to a plurality of memory units, and each of the row selection control lines is coupled to a plurality of memory units. This enables concerns for congestion of the wiring lines to be reduced, and consequently enables layout to be facilitated.

Modification Example 1

In the foregoing embodiment, the plurality of column selection line predecoders 21 is disposed at an end in the Y-direction (upper side in FIG. 17), and the plurality of row selection line predecoders 24 is disposed at an end in the X-direction (left side in FIG. 17), but this is not limitative. For example, instead of this, as in a memory unit array 60 illustrated in FIG. 18, a plurality of column selection line predecoders 61 may be disposed at an end in the X-direction (left side in FIG. 18) and a plurality of row selection line predecoders 64 may be disposed at an end in the Y-direction (upper side in FIG. 18). In this example, a column selection control line 63 extends in the X-direction, and a row selection control line 66 extends in the Y-direction. It is to be noted that the configuration of each memory unit 30 is the same as that in the foregoing embodiment (FIGS. 8, 9, and 12). In other words, as illustrated in FIGS. 8 and 9, column selection lines CL extend in the Y-direction, and row selection lines RL extend in the X-direction.

The column selection control line 63 is formed using the wiring layers LM2 and LM3, for example. As illustrated in FIG. 18, the column selection control line 63 is disposed to pass near the middle of the memory unit 30 coupled to the column selection control line 63. In this memory unit 30, a region where the column selection control line 63 is formed is close to regions where the column selection line drivers (CLDs) 40A and 40B are formed in portions W11 and W12 indicated by thick lines. The column selection control line 63 is coupled to the column selection line driver (CLD) 40A through a wiring line, a via VA, and the like in this portion W11, and is coupled to the column selection line driver (CLD) 40B through a wiring line, a via VA, and the like in this portion W12.

The row selection control line 66 is formed using the wiring layers LM2 and LM3, for example. As illustrated in FIG. 18, the row selection control line 66 is disposed to pass through an end of the memory unit 30 coupled to the row selection control line 66. Therefore, in this memory unit 30, a region where the row selection control line 66 is formed is close to regions where the row selection line drivers (RLDs) 50A and 50B are formed in portions W13 to W16 indicated by thick lines. The row selection control line 66 coupled to the row selection line predecoder 64($n$−1) is coupled to the row selection line driver (RLD) 50A through a wiring line, a via VA, and the like in the portions W13 and W14. Likewise, the row selection control line 66 coupled to the row selection line predecoder 64($n$+1) is coupled to the row selection line driver (RLD) 50B through a wiring line, a via VA, and the like in the portions W15 and W16.

In a region where the column selection control line 63 intersects the row selection control line 66, it is desirable to cause the column selection control line 63 and the row selection control line 66 to intersect each other by, for example, temporarily changing a layer in which the column selection control line 63 is formed from the wiring layers LM2 and LM3 to the wiring layer LM1.

Here, the column selection line predecoder 61 corresponds to a specific example of a "first generator" in the present disclosure. The column selection control line 63 corresponds to a specific example of a "first selection control line" in the present disclosure. The row selection line predecoder 64 (for example, the row selection line predecoders 64($n$−1) and 64($n$+1)) corresponds to a specific example of a "second generator" in the present disclosure. The column selection control line 66 corresponds to a specific example of a "second selection control line" in the present disclosure.

Modification Example 2

In the foregoing embodiment, as illustrated in FIG. 12, in the memory unit 30, the connections 101A and 101B that couple the column selection line CL to the column selection line driver (CLD) 40 are disposed close to two sides (upper side and lower side in FIG. 12) of the memory unit 30 that are opposed in the Y-direction, but this is not limitative. In the following, a memory unit array 120 according to the present modification example is described in detail.

The memory unit array 120 includes a plurality of column selection line predecoders 161, a plurality of column selection control lines 163, a plurality of row selection line predecoders 164, a plurality of row selection control lines 166, and a plurality of memory units 130. Each of the memory units 130 includes a column selection line driver (CLD) 140 (column selection line drivers (CLDs) 140A and 140B) and a row selection line driver (RLD) 150 (row selection line drivers (RLDs) 150A and 150B).

FIG. 19 illustrates an example of column selection lines CL in the memory unit array 120. FIG. 20 illustrates an example of row selection lines RL in the memory unit array 120. FIG. 21 illustrates an example of a layout arrangement of the column selection line drivers (CLDs) 140A and 140B and the row selection line drivers (RLDs) 150A and 150B in the memory unit 130.

In this memory unit array 120, as illustrated in FIG. 19, a length of the column selection line CL is about twice a length of that in the foregoing embodiment (FIG. 8). Each of the column selection lines CL is coupled to the column selection line driver (CLD) 140 (the column selection line drivers (CLDs) 140A and 140B illustrated in FIG. 21) formed on the semiconductor substrate, through a connection 111 provided near the middle of the memory unit 130. Thus increasing the length of the column selection line CL enables the number of vias VA in the connection 111 to be reduced. In addition, as illustrated in FIG. 20, a length of the row selection line RL is about twice a length of that in the foregoing embodiment (FIG. 9). Each of the row selection lines RL is coupled to the row selection line driver (RLD) 150 (the row selection line drivers (RLDs) 150A and 150B illustrated in FIG. 21) through one of connections 112A and 112B provided close to respective two sides (left side and right side in FIG. 20) of the memory unit 130 that are opposed in the X-direction. Thus increasing the length of the row selection line RL enables the number of vias VA in the connections 112A and 112B to be reduced. In this example, no row selection line RL is formed near the middle of the memory unit 130, because the connection 111 is disposed As illustrated in FIG. 21, the column selection line driver (CLD) 140A is disposed in a region on the upper side of the connection 111 near the middle of the memory unit 130, and the column selection line driver (CLD) 140B is disposed in a region on the lower side of the connection 111 near the middle of the memory unit 130. In addition, the row selection line driver (RLD) 150A is disposed in a region close to the connection 112A, and the row selection line driver (RLD) 150B is disposed in a region close to the connection 112B.

FIG. 22 illustrates a layout example of the column selection control lines 163 and the row selection control lines 166. In this example, the plurality of column selection line predecoders 161 is disposed at an end in the X-direction (left side in FIG. 22), and the plurality of row selection line predecoders 164 is disposed at an end in the Y-direction (upper side in FIG. 22). The column selection control line 163 extends in the X-direction, and the row selection control line 166 extends in the Y-direction.

The column selection control line 163 is formed using the wiring layers LM2 and LM3, for example. As illustrated in FIG. 22, the column selection control line 163 is formed above the column selection line drivers (CLDs) 140A and 140B disposed near the middle of the memory unit 130 coupled to the column selection control line 163. In the memory unit 130, in a region W21 in which a region where the column selection control line 163 is formed overlaps a region where the column selection line driver (CLD) 140A is formed, the column selection control line 163 is coupled to the column selection line driver (CLD) 140A through a via VA and the like. Likewise, in the memory unit 130, in a region W22 in which a region where the column selection control line 163 is formed overlaps a region where the column selection line driver (CLD) 140B is formed, the column selection control line 163 is coupled to the column selection line driver (CLD) 140B through a via VA and the like. In addition, when crossing an end of the memory unit 130, the column selection control line 163 passes through a place without a plurality of vias VA included in the connections 112A and 112B (FIG. 21). Hence, the column selection control line 163 is formed to be thin near the end of the memory unit 130.

The row selection control line 166 is formed using the wiring layers LM2 and LM3, for example. As illustrated in FIG. 22, the row selection control line 166 is formed above the row selection line drivers (RLDs) 150A and 150B of the memory unit 130 coupled to the row selection control line 166. The row selection control line 166 coupled to the row selection line predecoder 164(n−1) is coupled to the row selection line driver (RLD) 150A through a via VA and the like in a region W23. The row selection control line 166 coupled to the row selection line predecoder 164(n+1) is coupled to the row selection line driver (RLD) 150B through a via VA and the like in a region W24. In addition, when passing through the memory unit 130 not coupled to the row selection control line 166, the row selection control line 166 passes through a place without a plurality of vias VA included in the connection 111 (FIG. 21). Hence, the row selection control line 166 is formed to be thin in the memory unit 130 not coupled to the row selection control line 166.

The column selection control line 163 and the row selection control line 166 intersect each other in a region where the column selection line drivers (CLDs) 140A and 140B are formed, and intersect each other in a region where the row selection line drivers (RLDs) 150A and 150B are formed. In the region where the column selection line drivers (CLDs) 140A and 140B are formed, it is desirable to cause the column selection control line 163 and the row selection control line 166 to intersect each other by, for example, temporarily changing a layer in which the column selection control line 163 is formed from the wiring layers LM2 and LM3 to the wiring layer LM1. In the region where the row selection line drivers (RLDs) 150A and 150B are formed, it is desirable to cause the column selection control line 163 and the row selection control line 166 to intersect each other by, for example, temporarily changing a layer in which the row selection control line 166 is formed from the wiring layers LM2 and LM3 to the wiring layer LM1.

Here, the column selection line driver (CLD) 140 corresponds to a specific example of a "first driver" in the present disclosure. The row selection line driver (RLD) 150 corresponds to a specific example of a "second driver" in the present disclosure. The column selection line predecoder 161 corresponds to a specific example of a "first generator" in the present disclosure. The column selection control line 163 corresponds to a specific example of a "first selection control line" in the present disclosure. The row selection line predecoder 164 (for example, the row selection line predecoders 164(n−1) and 164(n+1)) corresponds to a specific example of a "second generator" in the present disclosure. The column selection control line 166 corresponds to a specific example of a "second selection control line" in the present disclosure.

Modification Example 3

In the foregoing embodiment, in the memory unit 30, the column selection line driver (CLD) 40 and the row selection line driver (RLD) are formed on the semiconductor substrate below a memory region where the memory cells MC are formed, but this is not limitative. In the following, a memory unit array 220 according to the present modification example is described in detail.

The memory unit array 220 includes a plurality of column selection line predecoders 261, a plurality of column selection control lines 263, a plurality of row selection line predecoders 264, a plurality of row selection control lines 266, and a plurality of memory units 230. Each of the memory units 230 includes a column selection line driver (CLD) 240 (column selection line drivers (CLDs) 240A and 240B) and a row selection line driver (RLD) 250 (row selection line drivers (RLDs) 250A and 250B).

FIG. 23 illustrates an example of column selection lines CL in the memory unit array 220. FIG. 24 illustrates an example of row selection lines RL in the memory unit array 220. FIG. 25 illustrates an example of a layout arrangement of the column selection line drivers (CLDs) 240A and 240B and the row selection line drivers (RLDs) 250A and 250B in the memory unit 230.

In this memory unit array 220, as illustrated in FIG. 23, each of the column selection lines CL is formed across two memory units 230 adjacent to each other in the Y-direction. Each of the column selection lines CL is coupled to the column selection line driver (CLD) 240 (the column selection line drivers (CLDs) 240A and 240B illustrated in FIG. 25) formed on the semiconductor substrate, through one of connections 121A and 121B provided close to respective two sides (upper side and lower side in FIG. 23) of the memory unit 230 that are opposed in the Y-direction. In addition, as illustrated in FIG. 24, each of the row selection lines RL is formed across two memory units 230 adjacent to each other in the X-direction. Each of the row selection lines RL is coupled to the row selection line driver (RLD) 250 (the row selection line drivers (RLDs) 250A and 250B illustrated in FIG. 25), through one of connections 122A and 122B provided close to respective two sides (left side and right side in FIG. 24) of the memory unit 230 that are opposed in the X-direction.

The column selection line driver (CLD) 240A is disposed in a region close to the connection 121A, and the column selection line driver (CLD) 240B is disposed in a region close to the connection 121B. As illustrated in FIGS. 24 and 25, the column selection line drivers (CLDs) 240A and 240B are disposed in a region where no row selection line RL is formed. That is to say, the column selection line drivers (CLDs) 240A and 240B are disposed in a region other than a memory region where the memory cells MC are formed. In addition, the row selection line driver (RLD) 250A is disposed in a region close to the connection 122A, and the row selection line driver (RLD) 250B is disposed in a region close to the connection 122B. As illustrated in FIGS. 23 to 25, the row selection line drivers (RLDs) 250A and 250B are disposed in a region where the column selection lines CL and the row selection lines RL are formed. That is to say, the row selection line drivers (RLDs) 250A and 250B are disposed in a memory region where the memory cells MC are formed.

FIG. 26 illustrates a layout example of the column selection control lines 263 and the row selection control lines 266. In this example, the plurality of column selection line predecoders 261 is disposed at an end in the X-direction (left side in FIG. 26), and the plurality of row selection line predecoders 264 is disposed at an end in the Y-direction (upper side in FIG. 26). The column selection control line 263 extends in the X-direction, and the row selection control line 266 extends in the Y-direction.

The column selection control line 263 is formed using the wiring layers LM2 and LM3, for example. As illustrated in FIG. 26, the column selection control line 263 is formed above the column selection line drivers (CLDs) 240A and 240B of the memory unit 230 coupled to the column selection control line 263. Therefore, a region where the column selection control line 263 is formed overlaps regions where the column selection line drivers (CLDs) 240A and 240B are formed in regions W31 and W32 surrounded by thick lines in FIG. 26. The column selection control line 263 coupled to the column selection line predecoder 261(*m*) is coupled to the column selection line driver (CLD) 240A through a via VA and the like in the region W31. Likewise, the column selection control line 263 coupled to the column selection line predecoder 261(*m*+1) is coupled to the column selection line driver (CLD) 240B through a via VA and the like in the region W32.

The row selection control line 266 is formed using the wiring layers LM2 and LM3, for example. As illustrated in FIG. 26, the row selection control line 266 is formed above the row selection line drivers (RLDs) 250A and 250B of the memory unit 230 coupled to the row selection control line 266. Therefore, a region where the row selection control line 266 is formed overlaps regions where the row selection line drivers (RLDs) 250A and 250B are formed in regions W33 and W34 surrounded by thick lines in FIG. 26. The row selection control line 266 coupled to the row selection line predecoder 264(*n*−1) is coupled to the row selection line driver (RLD) 250A through a via VA and the like in the region W33. The row selection control line 266 coupled to the row selection line predecoder 264(*n*) is coupled to the row selection line driver (RLD) 250B through a via VA and the like in the region W34.

In a region where the column selection control line 263 intersects the row selection control line 266, it is desirable to cause the column selection control line 263 and the row selection control line 266 to intersect each other by, for example, temporarily changing a layer in which the column selection control line 263 is formed from the wiring layers LM2 and LM3 to the wiring layer LM1.

Here, the column selection line driver (CLD) 240 corresponds to a specific example of a "first driver" in the present disclosure. The row selection line driver (RLD) 250 corresponds to a specific example of a "second driver" in the present disclosure. The column selection line predecoder 261 (for example, the column selection line predecoders 261(*m*) and 261(*m*+1)) corresponds to a specific example of a "first generator" in the present disclosure. The column selection control line 263 corresponds to a specific example of a "first selection control line" in the present disclosure. The row selection line predecoder 264 (for example, the row selection line predecoders 264(*n*−1) and 264(*n*)) corresponds to a specific example of a "second generator" in the present disclosure. The column selection control line 266 corresponds to a specific example of a "second selection control line" in the present disclosure.

Modification Example 4

In the foregoing embodiment, the nonvolatile memory 13 is caused to store late failure information INF2, but this is not limitative. For example, the memory unit array 20 may be caused to store late failure information INF2. In this case, for example, the nonvolatile memory 13 may be omitted as in a memory system 1B illustrated in FIG. 27. This memory system 1B includes memory devices 90A and 90B. For example, the memory device 90A includes a microcontroller 94. The microcontroller 94 controls operation of the plurality of memory unit arrays 20 and the fuse memory 12.

Other Modification Examples

In addition, two or more of these modification examples may be combined.

Although the present technology has been described above referring to some embodiments and modification examples, the technology is not limited to these embodiments, etc., and may be modified in a variety of ways.

For example, in the foregoing embodiment, two storage layers are formed as illustrated in FIG. 5, but this is not limitative. One storage layer may be formed, or three or more storage layers may be formed.

In addition, for example, in the foregoing embodiment, the row selection control line 26 is formed using the wiring layers LM2 and LM3, but this is not limitative. For example, the row selection control line 26 may be formed using only the wiring layer LM1.

In addition, for example, in the foregoing embodiment, the column selection control line 23 and the row selection control line 26 are formed using the wiring layers LM2 and LM3, but this is not limitative. For example, in addition to the wiring layers LM2 and LM3, the wiring layer LM4 (FIG. 10) may be further used for wiring. In addition, for example, a gate electrode of a transistor may be used for wiring.

In addition, for example, in the foregoing embodiment, the three wiring layers LM1 to LM3 are provided below the selection wiring layer LRL1 as illustrated in FIG. 10, but this is not limitative. Instead of these, four or more wiring layers may be provided, for example.

In addition, for example, in the foregoing embodiment, the column selection line driver (CLD) 40 selects one column selection line CL, but this is not limitative. For example, two or more column selection lines CL may be selected. Likewise, the row selection line driver (RLD) 50 selects one row selection line RL, but this is not limitative. For example, two or more row selection lines RL may be selected.

In addition, for example, the number of the memory units 30 in the memory unit array 20, the number of column selection lines CL and the number of row selection lines RL in each memory unit 30, the number of spare column selection lines CL and the number of spare row selection lines RL, and the like in the foregoing embodiment are examples, and may be changed as appropriate.

It is to be noted that effects described herein are merely illustrative and are not limitative, and may have other effects.

It is to be noted that the present technology may have the following configurations.

(1) A storage device, including:
a plurality of first wiring lines provided in a first region, the plurality of first wiring lines extending in a first direction and including a plurality of first selection lines and a plurality of second selection lines;
a plurality of second wiring lines provided in the first region, the plurality of second wiring lines extending in a second direction and including a plurality of third selection lines and a plurality of fourth selection lines, the second direction intersecting the first direction;
a plurality of first memory cells each inserted between a corresponding one of the plurality of first wiring lines and a corresponding one of the plurality of second wiring lines;
a first driver including a first selection line driver that drives the plurality of first selection lines on a basis of a first selection control signal and a second selection line driver that drives the plurality of second selection lines on a basis of the first selection control signal, the first selection line driver and the second selection line driver being arranged side-by-side in the first direction; and
a second driver including a third selection line driver that drives the plurality of third selection lines on a basis of a second selection control signal and a fourth selection line driver that drives the plurality of fourth selection lines on a basis of the second selection control signal, the third selection line driver and the fourth selection line driver being arranged side-by-side in the second direction.

(2) The storage device according to (1), further including:
a first generator that generates the first selection control signal on a basis of a first address signal, and outputs a predetermined selection control signal as the first selection control signal in a case where the first address signal indicates a first address; and
a second generator that generates the second selection control signal on a basis of a second address signal, and outputs a predetermined selection control signal as the second selection control signal in a case where the second address signal indicates a second address.

(3) The storage device according to (2), in which
the first generator includes a first register that stores the first address, and
the second generator includes a second register that stores the second address.

(4) The storage device according to (2) or (3), further including:
a first selection control line that extends in the first direction and transmits the first selection control signal; and
a second selection control line that extends in the second direction and transmits the second selection control signal.

(5) The storage device according to (2) or (3), further including:
a first selection control line that extends in the second direction and transmits the first selection control signal; and
a second selection control line that extends in the first direction and transmits the second selection control signal.

(6) The storage device according to (4) or (5), in which
a plurality of the first selection control lines is formed in a region where the first selection line driver is formed and a region where the second selection line driver is formed.

(7) The storage device according to (5), in which
a plurality of the first selection control lines is formed in a region other than a region where the first selection line driver and the second selection line driver are formed.

(8) The storage device according to any one of (2) to (7), further including:
a plurality of third wiring lines provided in a second region, the plurality of third wiring lines extending in the first direction and including a plurality of fifth selection lines and a plurality of sixth selection lines;
a plurality of fourth wiring lines provided in the second region, the plurality of fourth wiring lines extending in the second direction and including a plurality of seventh selection lines and a plurality of eighth selection lines;
a plurality of second memory cells each inserted between a corresponding one of the plurality of third wiring lines and a corresponding one of the plurality of fourth wiring lines;
a third driver including a fifth selection line driver that drives the plurality of fifth selection lines on a basis of a third selection control signal and a sixth selection line driver that drives the plurality of sixth selection lines on a basis of the third selection control signal, the fifth selection line driver and the sixth selection line driver being arranged side-by-side in the first direction; and
a fourth driver including a seventh selection line driver that drives the plurality of seventh selection lines on a basis of the second selection control signal and an eighth selection line driver that drives the plurality of eighth selection lines on a basis of the second selection control signal, the seventh selection line driver and the eighth selection line driver being arranged side-by-side in the second direction.

(9) The storage device according to (8), further including a third generator that generates the third selection control signal on a basis of the first address signal, and outputs a predetermined selection control signal as the third selection control signal in a case where the first address signal indicates a third address.

(10) The storage device according to any one of (2) to (9), further including:
a plurality of fifth wiring lines provided in a third region, the plurality of fifth wiring lines extending in the first direction and including a plurality of ninth selection lines and a plurality of tenth selection lines;
a plurality of sixth wiring lines provided in the third region, the plurality of sixth wiring lines extending in the second direction and including a plurality of eleventh selection lines and a plurality of twelfth selection lines;
a plurality of third memory cells each inserted between a corresponding one of the plurality of fifth wiring lines and a corresponding one of the plurality of sixth wiring lines;
a fifth driver including a ninth selection line driver that drives the plurality of ninth selection lines on a basis of the first selection control signal and a tenth selection line driver that drives the plurality of tenth selection lines on a basis of the first selection control signal, the ninth selection line driver and the tenth selection line driver being arranged side-by-side in the first direction; and a sixth driver including an eleventh selection line driver that drives the plurality of eleventh selection lines on a basis of a fourth selection control signal and a twelfth selection line driver that drives the plurality of twelfth selection lines on a basis of the fourth selection control signal, the eleventh selection line driver and the twelfth selection line driver being arranged side-by-side in the second direction.

(11) The storage device according to (10), further including a fourth generator that generates the fourth selection control signal on a basis of the second address signal, and outputs a predetermined selection control signal as the fourth selection control signal in a case where the second address signal indicates a fourth address.

This application claims the benefit of Japanese Priority Patent Application No. 2017-59523 filed with the Japan Patent Office on Mar. 24, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A storage device, comprising:
a plurality of first wiring lines in a first region, wherein
the plurality of first wiring lines extends in a first direction, and
the plurality of first wiring lines includes a plurality of first selection lines and a plurality of second selection lines;
a plurality of second wiring lines in the first region, wherein
the plurality of second wiring lines extends in a second direction,
the plurality of second wiring lines includes a plurality of third selection lines and a plurality of fourth selection lines, and
the second direction intersects the first direction; and
a plurality of first memory cells, wherein
each of the plurality of first memory cells is between a corresponding one of the plurality of first wiring lines and a corresponding one of the plurality of second wiring lines,
each of the plurality of first memory cells includes a first driver and a second driver,
the first driver includes a first selection line driver and a second selection line driver,
the first selection line driver is configured to drive the plurality of first selection lines based on a first selection control signal,
the second selection line driver is configured to drive the plurality of second selection lines based on the first selection control signal,
the first selection line driver is opposite to the second selection line driver in the first direction,
the second driver includes a third selection line driver and a fourth selection line driver,
the third selection line driver is configured to drive the plurality of third selection lines based on a second selection control signal,
the fourth selection line driver is configured to drive the plurality of fourth selection lines based on the second selection control signal, and
the third selection line driver is opposite to the fourth selection line driver in the second direction.

2. The storage device according to claim 1, further comprising:
a first generator configured to:
generate the first selection control signal based on a first address signal; and
output a first specific selection control signal as the first selection control signal based on the first address signal that indicates a first address; and
a second generator configured to:
generate the second selection control signal based on a second address signal; and
output a second specific selection control signal as the second selection control signal based on the second address signal that indicates a second address.

3. The storage device according to claim 2, wherein
the first generator includes a first register configured to store the first address, and
the second generator includes a second register configured to store the second address.

4. The storage device according to claim 2, further comprising:
a first selection control line that extends in the first direction, wherein the first selection control line is configured to transmit the first selection control signal; and
a second selection control line that extends in the second direction, wherein the second selection control line is configured to transmit the second selection control signal.

5. The storage device according to claim 2, further comprising:
a first selection control line that extends in the second direction, wherein the first selection control line is configured to transmit the first selection control signal; and
a second selection control line that extends in the first direction, wherein the second selection control line is configured to transmit the second selection control signal.

6. The storage device according to claim 4, wherein the first selection control line is in a second region that includes the first selection line driver and a third region that includes the second selection line driver.

7. The storage device according to claim 5, wherein
the first selection control line is in a second region, and
the second region is different from a third region that includes the first selection line driver and a fourth region that includes the second selection line driver.

8. The storage device according to claim 2, further comprising:
a plurality of third wiring lines in a second region, wherein
the plurality of third wiring lines extends in the first direction, and
the plurality of third wiring lines includes a plurality of fifth selection lines and a plurality of sixth selection lines;
a plurality of fourth wiring lines in the second region, wherein
the plurality of fourth wiring lines extends in the second direction, and the plurality of fourth wiring lines includes a plurality of seventh selection lines and a plurality of eighth selection lines; and a plurality of second memory cells, wherein each of the plurality of second memory cells is between a corresponding one of the plurality of third wiring lines and a corresponding one of the plurality of fourth wiring lines, each of the plurality of second memory cells includes a third driver and a fourth driver, the third driver includes a fifth selection line driver and a sixth selection line driver, the fifth selection line driver is configured to drive the plurality of fifth selection lines based on a third selection control signal, the sixth selection line driver is configured to drive the plurality of sixth selection lines based on the third selection control signal, the fifth selection line driver is opposite to the sixth selection line driver in the first direction, the fourth driver includes a seventh selection line driver and an eighth selection line driver, the seventh selection line driver is configured to drive the plurality of seventh selection lines based on the second selection control signal, the eighth selection line driver is configured to drive the plurality of eighth selection lines based on the second selection control signal, and the seventh selection line driver is opposite to the eighth selection line driver in the second direction.

9. The storage device according to claim 8, further comprising a third generator configured to:

generate the third selection control signal based on the first address signal; and output a third specific selection control signal as the third selection control signal based on the first address signal that indicates a third address.

10. The storage device according to claim 2, further comprising:

a plurality of fifth wiring lines in a third region, wherein the plurality of fifth wiring lines extends in the first direction, and the plurality of fifth wiring lines includes a plurality of ninth selection lines and a plurality of tenth selection lines;

a plurality of sixth wiring lines in the third region, wherein the plurality of sixth wiring lines extends in the second direction, and the plurality of sixth wiring lines includes a plurality of eleventh selection lines and a plurality of twelfth selection lines; and a plurality of third memory cells, wherein each of the plurality of third memory cells is between a corresponding one of the plurality of fifth wiring lines and a corresponding one of the plurality of sixth wiring lines, each of the plurality of third memory cells includes a fifth driver and a sixth driver, the fifth driver includes a ninth selection line driver and a tenth selection line driver, the ninth selection line driver is configured to drive the plurality of ninth selection lines based on the first selection control signal, the tenth selection line driver is configured to drive the plurality of tenth selection lines based on the first selection control signal, the ninth selection line driver is opposite to the tenth selection line driver in the first direction, the sixth driver includes an eleventh selection line driver and a twelfth selection line driver, the eleventh selection line driver is configured to drive the plurality of eleventh selection lines based on a fourth selection control signal, the twelfth selection line driver is configured to drive the plurality of twelfth selection lines based on the fourth selection control signal, and the eleventh selection line driver is opposite to the twelfth selection line driver in the second direction.

11. The storage device according to claim 10, further comprising a fourth generator configured to:

generate the fourth selection control signal based on the second address signal; and output a fourth specific selection control signal as the fourth selection control signal based on the second address signal that indicates a fourth address.

* * * * *